US005092424A

United States Patent [19]

Schreiber et al.

[11] Patent Number: 5,092,424

[45] Date of Patent: Mar. 3, 1992

[54] ELECTROACOUSTICAL TRANSDUCING WITH AT LEAST THREE CASCADED SUBCHAMBERS

[75] Inventors: William P. Schreiber, Ashland; Brian J. Gawronski, Northboro, both of Mass.

[73] Assignee: Bose Corporation, Framingham, Mass.

[21] Appl. No.: 621,531

[22] Filed: Dec. 3, 1990

[51] Int. Cl.[5] .............. H05K 5/00

[52] U.S. Cl. .............. 181/145; 181/156; 181/160; 181/199

[58] Field of Search .............. 181/156, 199, 144, 145, 181/148, 150; 381/159

[56] References Cited

U.S. PATENT DOCUMENTS

| | | | |
|---|---|---|---|
| 3,688,864 | 9/1972 | Guss | 181/145 X |
| 3,918,551 | 11/1975 | Rizo-Patron | 181/144 |
| 4,549,631 | 10/1985 | Bose | 181/156 X |
| 4,875,546 | 10/1989 | Krnan | 181/148 X |

*Primary Examiner*—Brian W. Brown

*Assistant Examiner*—Jae N. Noh

*Attorney, Agent, or Firm*—Fish & Richardson

[57] ABSTRACT

A loudspeaker system has at least a first electroacoustical transducer having a vibratable diaphragm for converting an input electrical signal into a corresponding acoustic output signal. An enclosure is divided into at least first, second and third subchambers by at least first and second dividing walls. The first dividing wall supports and coacts with the first electrical transducer to bound the first and second subchambers. At least a first passive radiator intercouples the first and third subchambers. At least a second passive radiator intercouples at least one of the second and third subchambers with the region outside the enclosure. Each passive radiator is characterized by acoustic mass. Each subchamber is characterized by acoustic compliance. The acoustic mass and acoustic compliances coact to establish at least three spaced frequencies in the passband of the loudspeaker system at which the deflection characteristic of the vibratable diaphragm as a function of frequency has a minimum.

17 Claims, 29 Drawing Sheets

ELECTROACOUSTICAL TRANSDUCING WITH AT LEAST THREE CASCADED SUBCHAMBERS

The present invention relates to loudspeaker systems having multiple subchambers and passive radiators, such as ports and drone cones. These systems comprise an acoustic source so coupled to a series of higher order acoustic filters as to produce an acoustic output which is frequency band limited and whose acoustic power output in that band is generally constant as a function of frequency. The series of acoustic filters are typically embodied as acoustic compliances (enclosed volumes of air) and acoustic masses (passive radiators or ports).

For background reference is made to Bose U.S. Pat. No. 4,549,631 and the dual chamber systems described by Earl R. Geddes in his May 1989 article in the *Journal of the Audio Engineering Society* "An introduction to Band-Pass Loudspeaker Systems," which discloses using components to achieve higher order rolloffs of high frequencies.

All embodiments of the invention have the following advantages:

1. Relatively low average cone excursion in the bandpass region, i.e., relatively low distortion for large signal output for a given transducer size.
2. Relatively high output in this bandpass region for a given enclosure volume.
3. The use of common, practical, economically configured transducers as the drive units.
4. Relatively higher order rolloff of high frequencies.
5. Achieving the bandpass characteristic without external electrical elements, resulting in relatively low cost, relatively high performance and relatively high reliability.
6. A transient response which is delayed in time by up to or greater than 10 milliseconds.

These embodiments may be used in any acoustic application where a bandpass output is desired, where low distortion is desired, where high output is desired, and/or where economically configured transducers are desired. Their uses include, but are not limited to, bass boxes for musical instruments, permanently installed sound systems for homes or auditoria, and for nonlocalizable bass output components in multiple speaker configurations in which the desired sonic imaging is to be controlled by the higher frequency components of those multiple speaker configurations.

For any speaker system driven at high input electrical signal at a specified frequency, distortion components generated by the speaker system are generally higher in frequency than the specified frequency. If the specified frequency is in the bass region, these higher frequency distortion components make it easier for the listener to detect the speaker system location. In addition, most distortion has multiple frequency components resulting in a wideband distortion spectrum which gives multiple (positively interacting) clues to the listener as to the speaker system location. Because of the lower distortion generated by embodiments of this invention compared to prior art, these embodiments are more useful as nonlocalizable bass output components in multiple speaker configurations in which the desired sonic imaging is to be controlled by the higher frequency components of those multiple speaker configurations.

The higher order rolloff ($\geqq 18$ dB/octave) of high frequencies for embodiments of this invention enhances its nonlocalizability. On complex signals (music or speech), the listener will receive significant directional cues only from the higher frequency components of the speaker system. Thus, these embodiments are more useful than prior art as nonlocalizable bass output components in multiple speaker configurations in which the desired sonic imaging is to be controlled by the higher frequency components of those multiple speaker configurations.

Experiments performed by K. deBoer, Haas, Wallach, and others indicate that a listener's ability to correctly locate sources of sounds depends on the relative time difference of the sounds coming from those sources. If spectrally identical sounds are produced by two sources spaced a few meters apart, but one source produces the sound a few milliseconds later than the other, the listener will ignore the later source and identify the earlier source as the sole producer of both sounds (Precedence Effect). Embodiments of this invention produce a greater time delay than prior art and thus are more useful for providing nonlocalizable bass output components in multiple speaker configurations in which the desired sonic imaging is to be controlled by the higher frequency components of those multiple speaker configurations.

Although all these exemplary configurations and volume and acoustic mass ratios describe embodiments whose acoustic power output is generally flat with frequency in the passband, this may not be the desired shape in certain applications, such as applications where the electrical input signal is equalized with frequency. For any desired frequency contour, a similar set of volume and acoustic mass ratios may be worked out for each configuration.

In addition, as variations of the basic embodiments described herein, internal subchambers may be connected via passive radiator means not only to other subchambers but, in addition, to the region outside the enclosure. For a desired flat frequency response output, this may result in somewhat different volume and acoustic mass ratios for each configuration.

In addition, as variations of the basic embodiments described herein, various internal subchambers may be connected by passive radiator means to only one other subchamber and not directly coupled to the region outside the enclosure. For a desired flat frequency response output, this may result in somewhat different volume and acoustic mass ratios for each configuration.

For background reference is made to Bose U.S. Pat. No. 4,549,631 incorporated herein by reference. This patent discloses an enclosure divided into ported subchambers by a baffle carrying a loudspeaker driver.

According to the invention, there is an enclosure with a first dividing wall supporting one or more electroacoustical transducers and separating first and second subchambers. These first and second subchambers are each separated from subsequent subchambers by dividing walls containing passive radiators, such as port means or drone cones, to couple these subchambers to one another or to the region outside the enclosure. At least one subchamber has an exterior wall which carries passive radiator means to couple the acoustic energy of the loudspeaker system with the region outside the enclosure.

Numerous other features, objects and advantages of the invention will become apparent from the following detailed description when read in connection with the accompanying drawings in which.

With reference now to the drawings, the description of most embodiments includes:

1) a physical description of that embodiment;

2) a drawing of that embodiment;

3) an electrical circuit analog of that embodiment;

4) parameter values for a typical configuration of that embodiment;

5) performance parameters for the typical configuration of (4); e.g., radiated power and cone displacement as functions of frequency;

6) a description of the advantages of the embodiment; and 7) a range of volume and passive radiator acoustic mass ratios which produce a frequency power response which is generally constant with frequency over the band pass range of frequencies.

Figure 1:
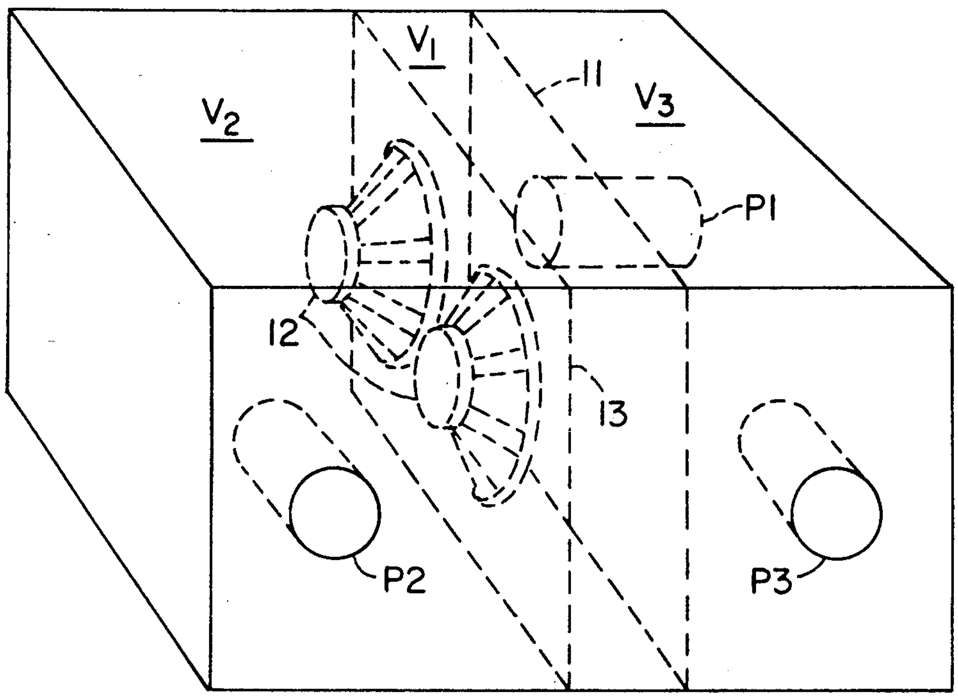
FIG. 1 is a perspective pictorial representation of an exemplary embodiment of the invention.
Figure 2:
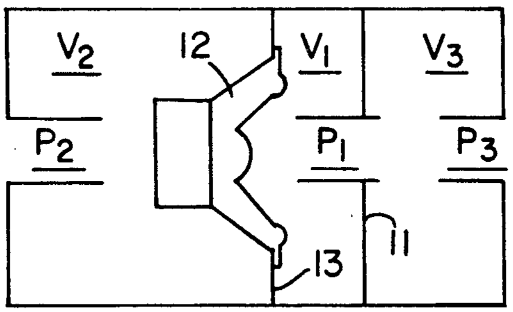
FIG. 2 is a simplified cross section of the embodiment of FIG. 1.

Referring to FIGS. 1 and 2, there are shown a perspective pictorial view and a simplified cross section thereof, respectively, of an embodiment of the invention. In this embodiment, a second dividing wall 11 separates the first internal subchamber V1 from a third subchamber V3 and carries a passive radiator means P1 intercoupling the first internal V1 and third V3 subchambers. The second V2 and third V3 subchambers each has an exterior wall which carries a passive radiator or port means P2 and P3, respectively, for radiating acoustic energy to the region outside the enclosure.

Woofer loudspeaker drivers 12 are mounted on first dividing wall 13 that separates the first internal subchamber V1 from the second subchamber V2.

Figure 3:
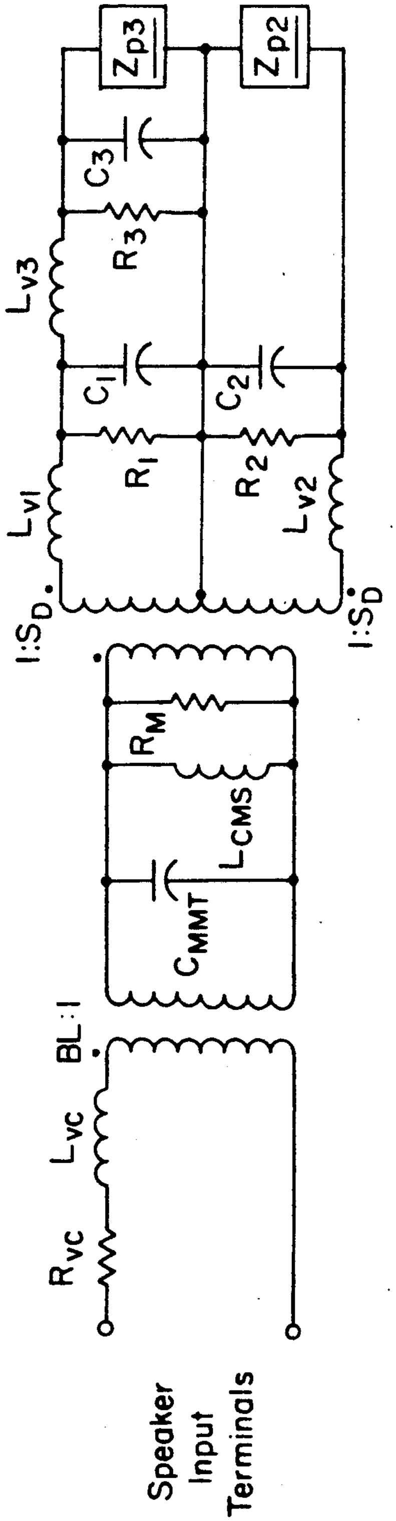
FIG. 3 is an electrical circuit analog of the embodiment of FIGS. 1 and 2.

Referring to FIG. 3, there is shown an electrical circuit analog schematic diagram of the embodiment of FIGS. 1 and 2. There follows representative parameter values.

2.79 ohms=Rvc=resistance of the voice of the driving transducer
0.00107 henries=Lvc=inductance of the voice coil of the driving transducer
11.61 nt./amp.=BL=product of flux density in the voice coil gap and the length of voice coil wire in that gap
0.0532 kg=Cmmt=moving mass of the cone/voice coil
0.00027 M/nt.=Lcms=suspension compliance of the transducer
0.288 M/nt.-sec.=Rm=inverse of loss (mobility) of mechanical moving system, mechanical mhos.
0.0242 $m^2$=So=area of electroacoustical transducer diaphragm
$0.27\times10^{-7}m^5/nt=L_{v1}$=acoustic compliance of volume V1 ($0.00378m^3$)
$1.32\times10^{-7}m^5/nt=L_{v2}$=acoustic compliance of volume V2 ($0.0185m^3$)
$0.77\times10^{-7}m^5/nt=L_{v3}$=acoustic compliance of volume V3 ($0.0108m^3$)
81 $kg/m^4=C_1$=acoustic mass of port P1
144 $kg/m^4=C_2$=acoustic mass of port P2
42.6 $kg/m^4=C_3$=acoustic mass of port P3
0.0033 $m^5$/nt sec.=$R_1$=acoustic mobility in port Pl
0.01 $m^5$/nt sec.=$R_2$=acoustic mobility in port P2
0.005 $m^5$/nt sec.=$R_3$=acoustic mobility in port P3

$$12.8\times10^{-6}+\frac{1}{j\omega4.6}=Z_{p3}=\text{radiation impedance seen by port } P3$$

$$12.8\times10^{-6}+\frac{1}{j\omega4.6}=Z_{p2}=\text{radiation impedance seen by port } P2$$

Figure 4:
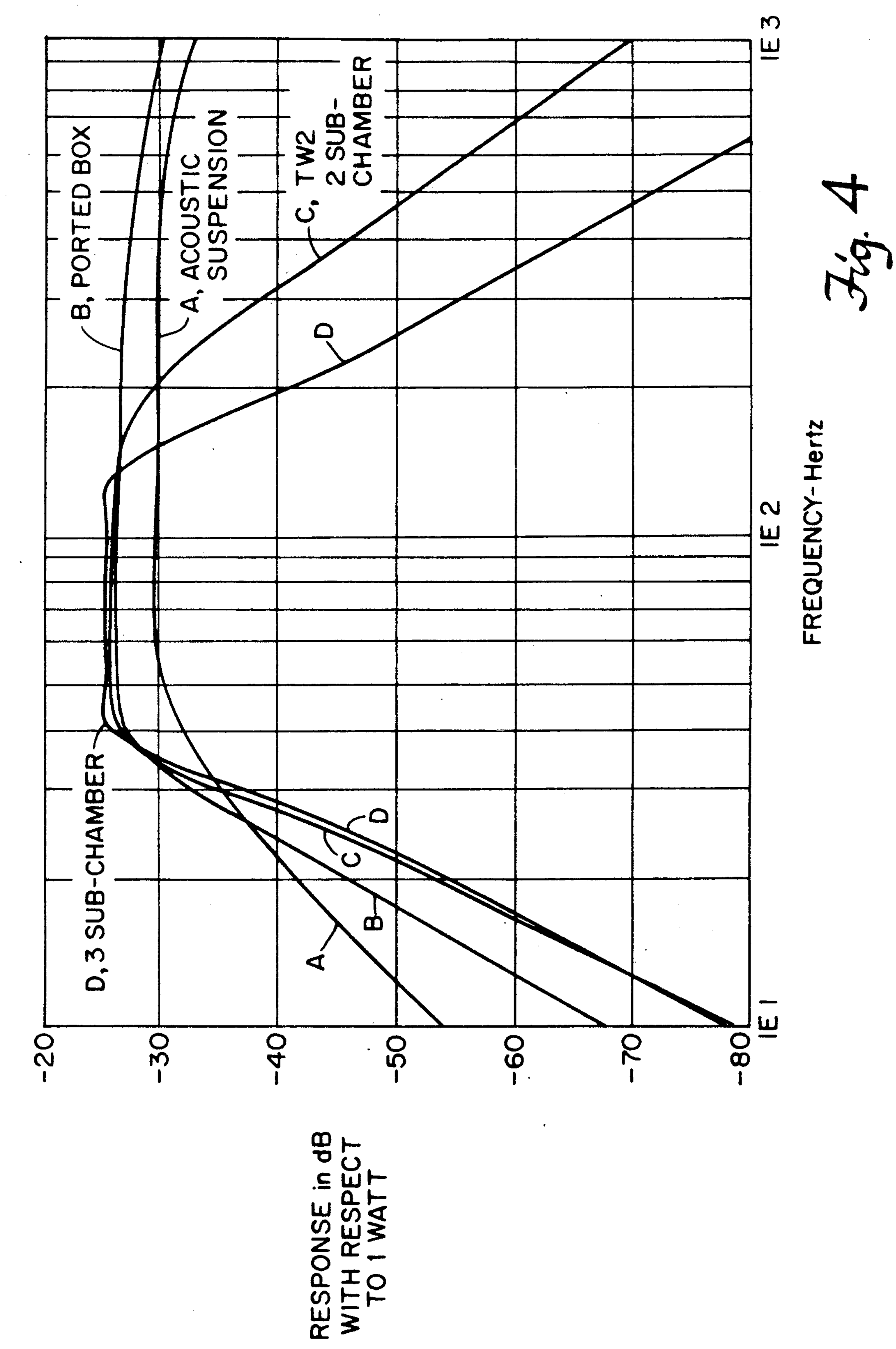
FIG. 4 shows the radiated acoustic output power as a function of frequency of the embodiment of FIGS. 1-3 compared with other enclosures.

Referring to FIG. 4, there is shown the acoustic power radiated by an acoustic suspension system as a function of frequency by curve A; a prior art ported system, by curve B; a prior art (per Bose U.S. Pat. No. 4,549,631) dual ported system, by curve C; and the embodiment of FIGS. 1-3 by curve D.

Each system has the same size woofer and the same total enclosure volume with the loudspeaker and port parameters having been appropriately optimized for each system by adjusting that system's elements to achieve flat frequency response. The embodiment of FIGS. 1-3 provides improved output in the bass region and a sharper cutoff at higher frequencies than the other enclosures.

Figure 5:
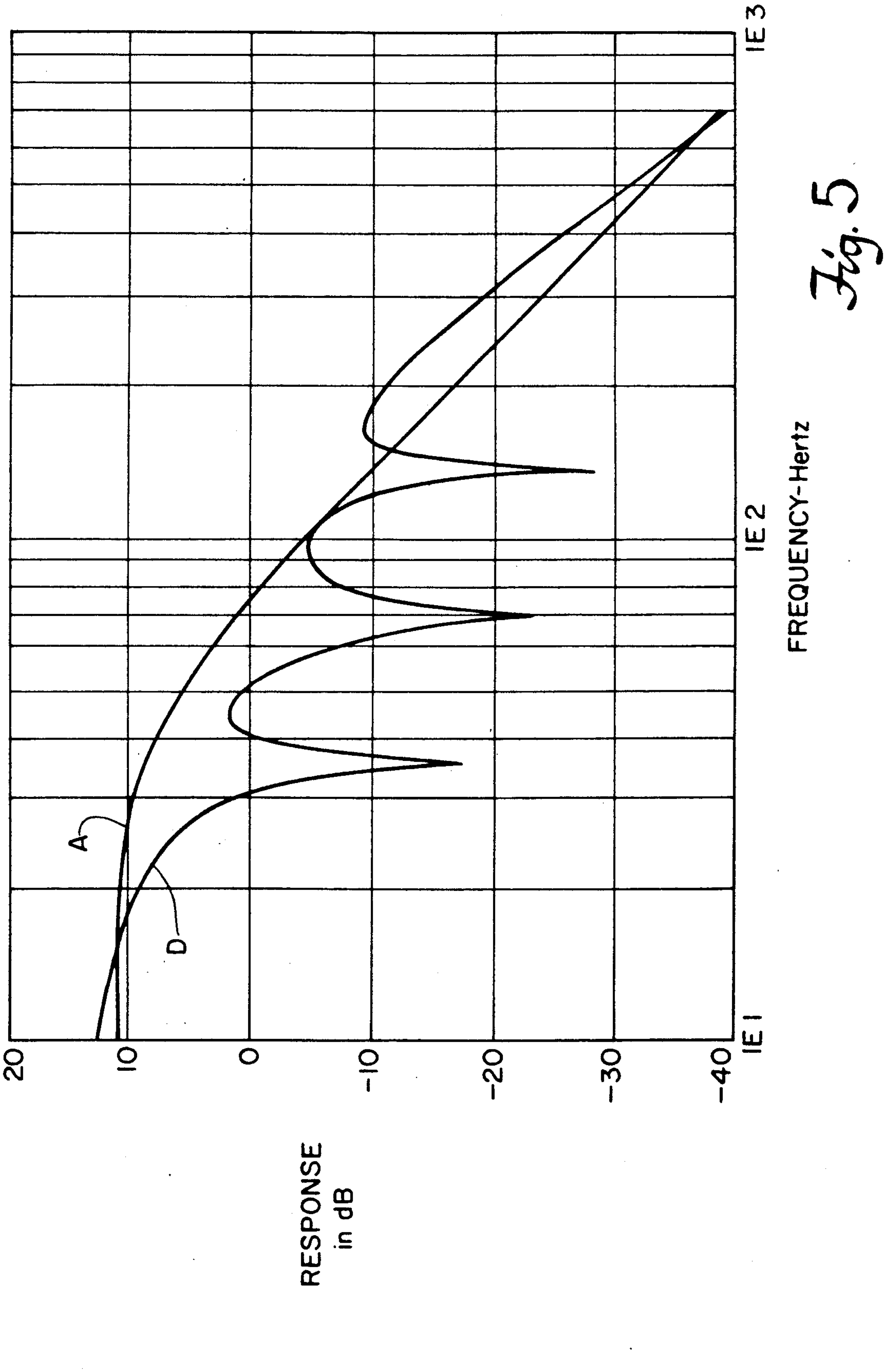
FIG. 5 is a graphical representation of diaphragm excursion as a function of frequency of the embodiment of FIGS. 1-3 compared with that of an acoustic suspension enclosure.

Referring to FIG. 5, there is shown a graphical representation of cone displacement as a function of frequency for a prior art acoustic suspension system, in curve A, and according to the invention, in curve D. Curve A shows that the cone excursion of the acoustic suspension speaker rises with decreasing frequency. A prior art ported system has one port resonance where the cone excursion is minimized. The two-subchamber system according to prior art (per Bose U.S. Pat. No. 4,541,631) has two passband resonances where the cone excursion can be minimized. Curve D shows that the three subchamber configuration according to this invention has three such resonances where the cone excursion is minimized. Thus, the overall cone excursion and thus, distortion, on bass frequency signals is lower in this configuration. The range of system enclosure parameters for the embodiment of FIGS. 1-3 that may produce the flat response and benefits described above are:

$$1\leq\frac{V3}{V1}$$

$$0.6\leq\frac{V2}{V1+V3}$$

$$0.5\leq\frac{C1}{C3}\leq4$$

$$0.5\leq\frac{C2}{C1+C3}\leq4$$

Figure 6:
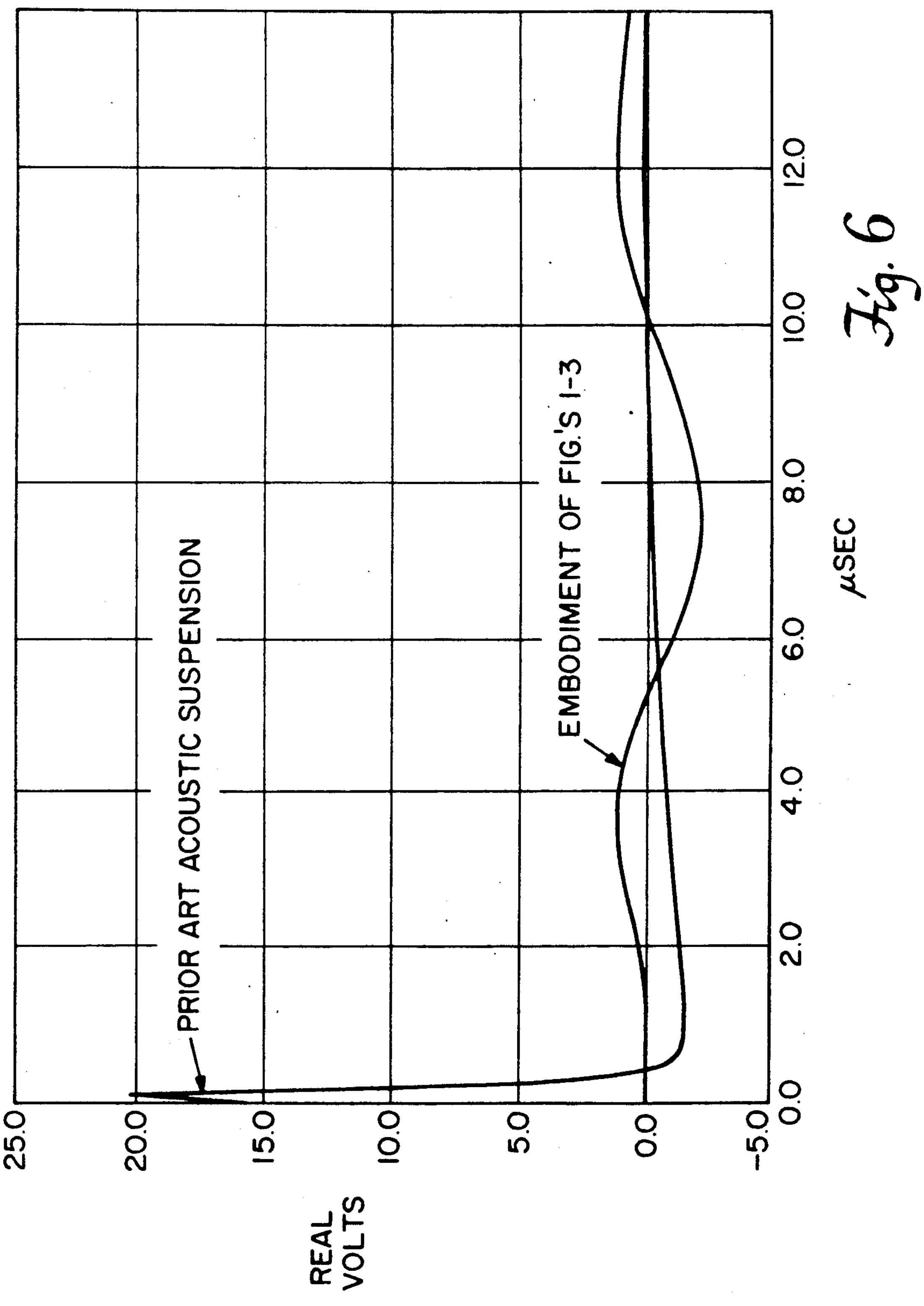
FIG. 6 is a graphical representation of the transient response of the embodiment of FIGS. 1-3 compared with that of an acoustic suspension enclosure.

Referring to FIG. 6, there is shown a graphical representation of impulse transient response of a prior art acoustic suspension system and the impulse transient response of the invention. The added time delay in the reproduction of the signal is particularly useful for nonlocalizable bass output components in multiple speaker configurations in which the desired sonic imaging is to be controlled by the higher frequency components of those multiple speaker configurations.

Figure 8:
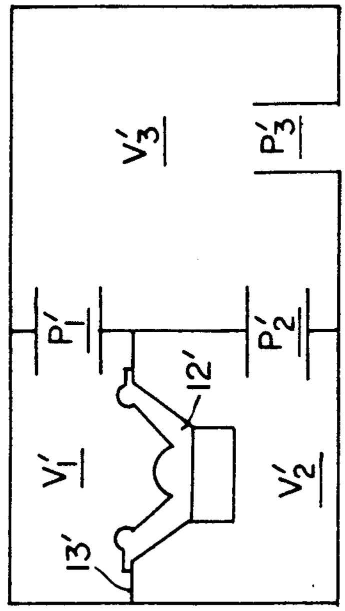
FIG. 8 is a simplified cross section of the embodiment of FIG., 7.
Figure 7:
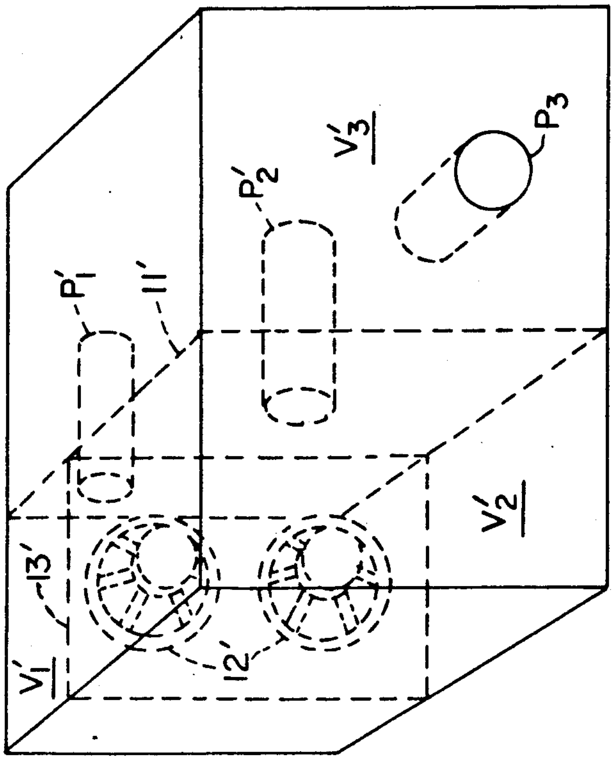
FIG. 7 is a pictorial perspective view of another embodiment of the invention.

Referring to FIGS. 7 and 8, there are shown pictorial perspective and simplified cross-section views, respectively, of another embodiment of the invention. In this embodiment, a second dividing wall 11' separates both the first V1' and second V2' internal subchambers from a third subchamber V3' and carries two passive radiator means P1' and P2' each intercoupling the first internal and third subchambers and the second internal and third subchambers, respectively. The third subchamber V3' has an exterior wall which carries a passive radiator or port means P3' for radiating acoustic energy to the region outside the enclosure.

Figure 9:
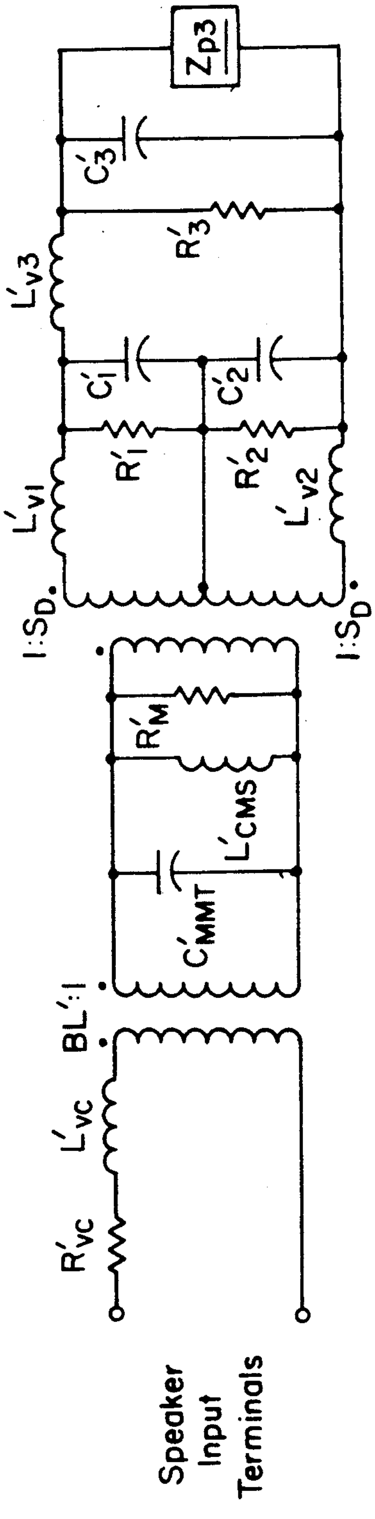
FIG. 9 is a schematic electrical circuit analog diagram of the embodiment of FIGS. 7 and 8.

Referring to FIG. 9, there is shown an electrical circuit analog schematic diagram of the embodiment of FIGS. 7 and 8. There follows typical parameter values for this embodiment.

2.79 ohms=Rvc'=resistance of the voice coil of the driving transducer
0.00107 henries=Lvc'=inductance of the voice coil of the driving transducer
11.15 nt./amp.=BL'=product of flux density in the voice coil gap and the length of voice coil wire in that gap
0.0512 kg=Cmmt'=moving mass of the cone/voice coil
0.00027 M/nt.=Lcms'=suspension compliance of the transducer
0.288 M/nt.-sec.=Rm'=inverse of loss (mobility) of mechanical moving system, mechanical mhos.
0.0242 $m^2S_o'$=area of electroacoustical transducer diaphragm
$0.355\times10^{-7}m^5/nt=L_{v1}'$=acoustic compliance of volume V1' ($0.00497m^3$)
$0.783\times10^{-7}m^5/nt=L_{v2}'$=acoustic compliance of volume V2' ($0.0109m^3$)
$1.222\times10^{-7}m/nt=L_{v3}'$=acoustic compliance of volume V3' ($0.0171m^3$)
53.8 $kg/m^4=C_1'$=acoustic mass of port P1'
191 $kg/m^4=C_2'$=acoustic mass of port P2'
33.25 $kg/m^4=C_3'$=acoustic mass of port P3'
0.004 $m^5$/nt sec.=$R_1'$=acoustic mobility in port P1'

0.008 $m^5$/nt sec. $=R_2'=$ acoustic mobility in port P2'
0.008 $m^5$/nt sec. $=R_3'=$ acoustic mobility in port P3'

$$12.8 \times 10^{-6} + \frac{1}{j\omega 4.6} = Z_{p3}' = \text{radiation impedance seen by port } P3'$$

Figure 10:
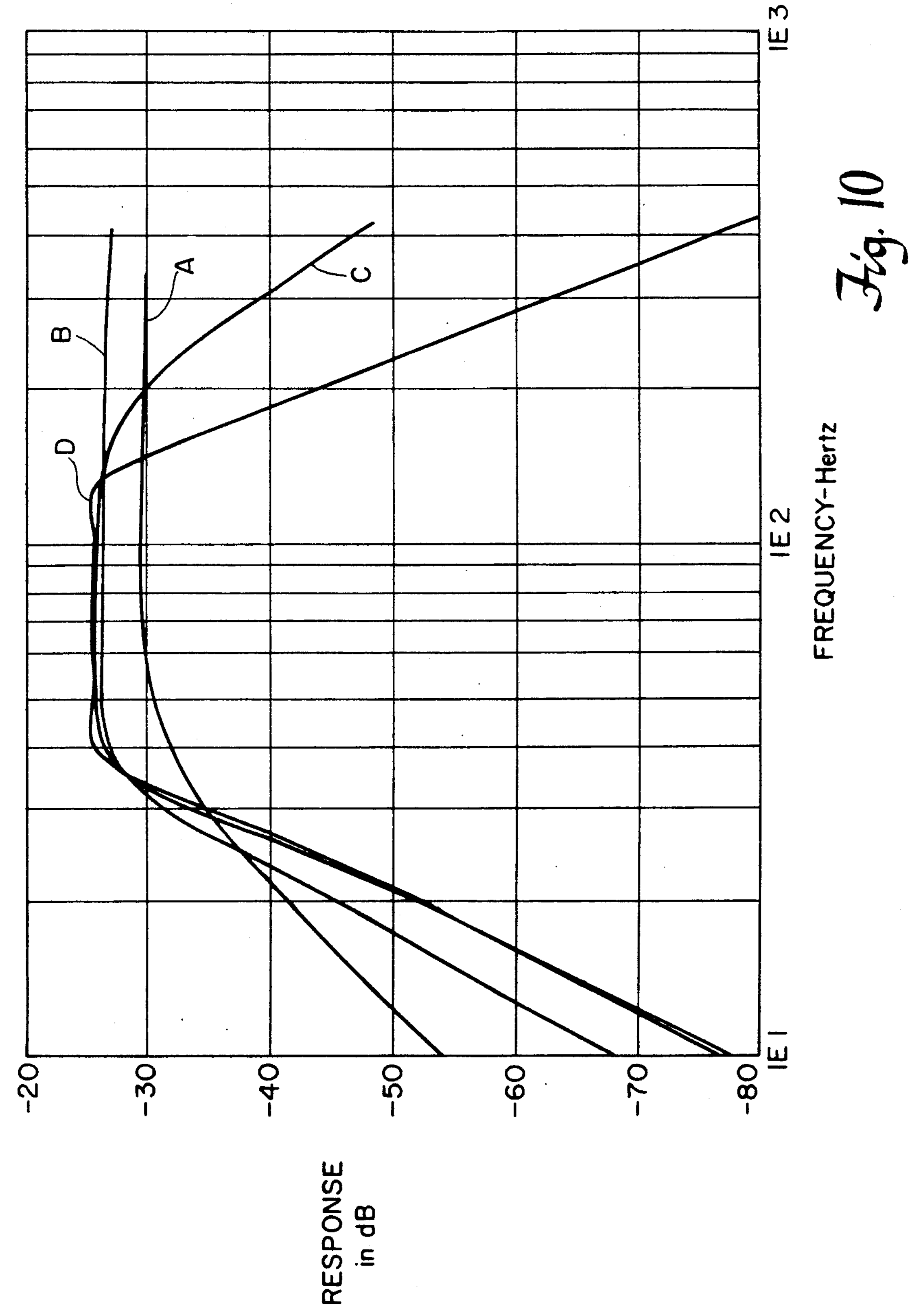
FIG. 10 is the output power frequency response of the embodiment of FIGS. 7-9 compared with other enclosures.

Referring to FIG. 10 there is shown the acoustic power radiated by an acoustic suspension system as a function of frequency by curve A; a prior art ported system, by curve B; prior art (per Bose U.S. Pat. No. 4,549,631) dual ported system, by curve C; and this configuration, by curve D.

Each system has the same size woofer and the same total enclosure volume with the loudspeaker and port parameters having been appropriately optimized for each system by adjusting that system's elements to achieve flat frequency response. This configuration provides improved output in the bass region and a sharper cutoff at higher frequencies than any of the prior art enclosures.

Figure 11:
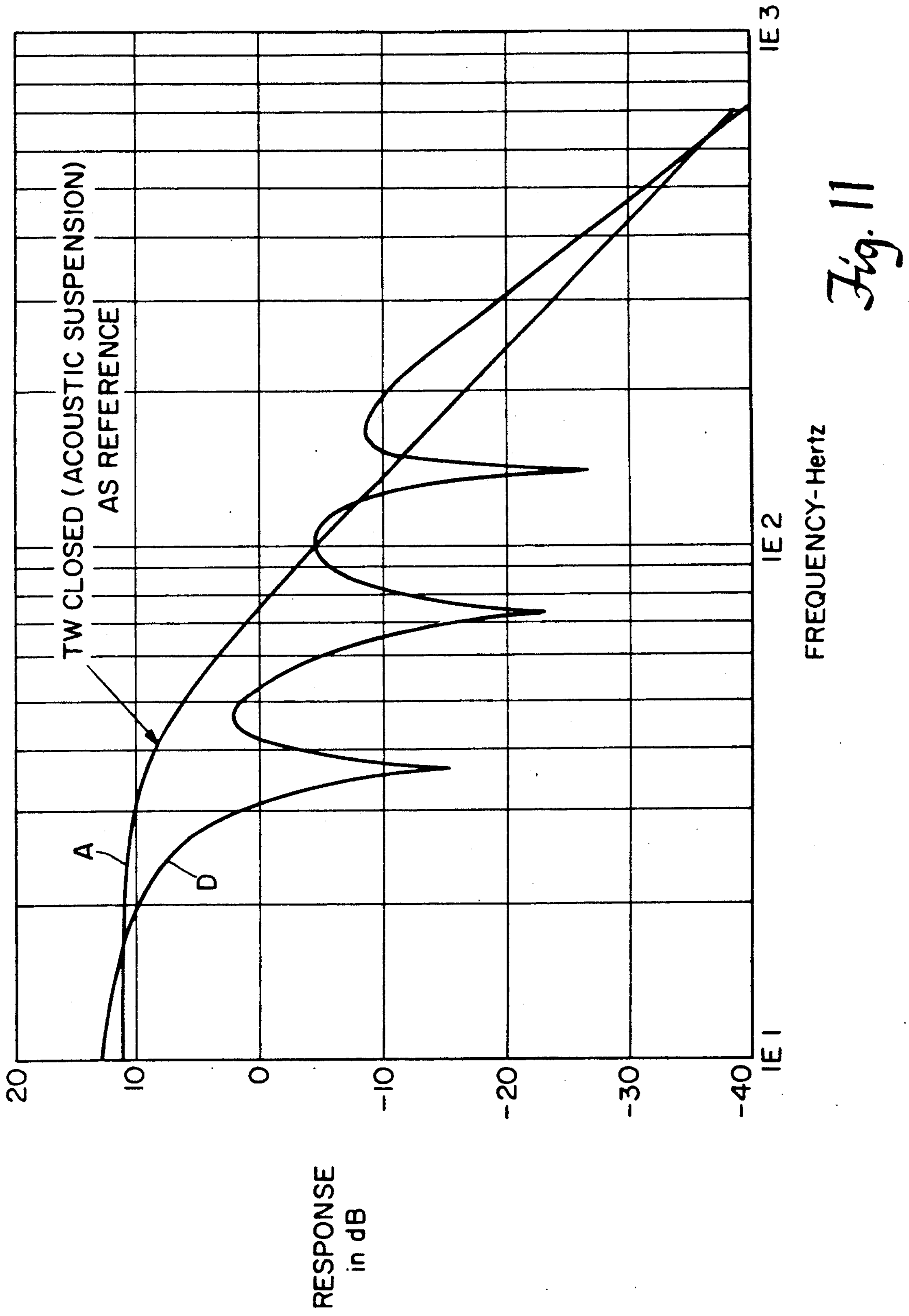
FIG. 11 shows diaphragm displacement as a function of frequency of the embodiment of FIGS. 7-9 compared with that of an acoustic suspension enclosure.

Referring to FIG. 11, there is shown a graphical representation of cone displacement as a function of frequency for a prior art acoustic suspension system, in curve A, and according to the invention, in curve D. Curve A shows that the cone excursion of the acoustic suspension speaker rises with decreasing frequency. Curve D shows that the three subchamber configuration according to this invention has three passband resonances where the cone excursion is minimized. Thus, the overall cone excursion and thus, distortion, on bass frequency signals is lower in this configuration. The range of system enclosure parameters for this embodiment that may produce the flat response and benefits described above are:

$$1 \leq \frac{V2}{V1} \leq 5$$

$$0.25 \leq \frac{V3}{V2 + V1}$$

$$1.2 \leq \frac{C2}{C1}$$

$$2 \leq \frac{C1 + C2}{C3}$$

Figure 11A:
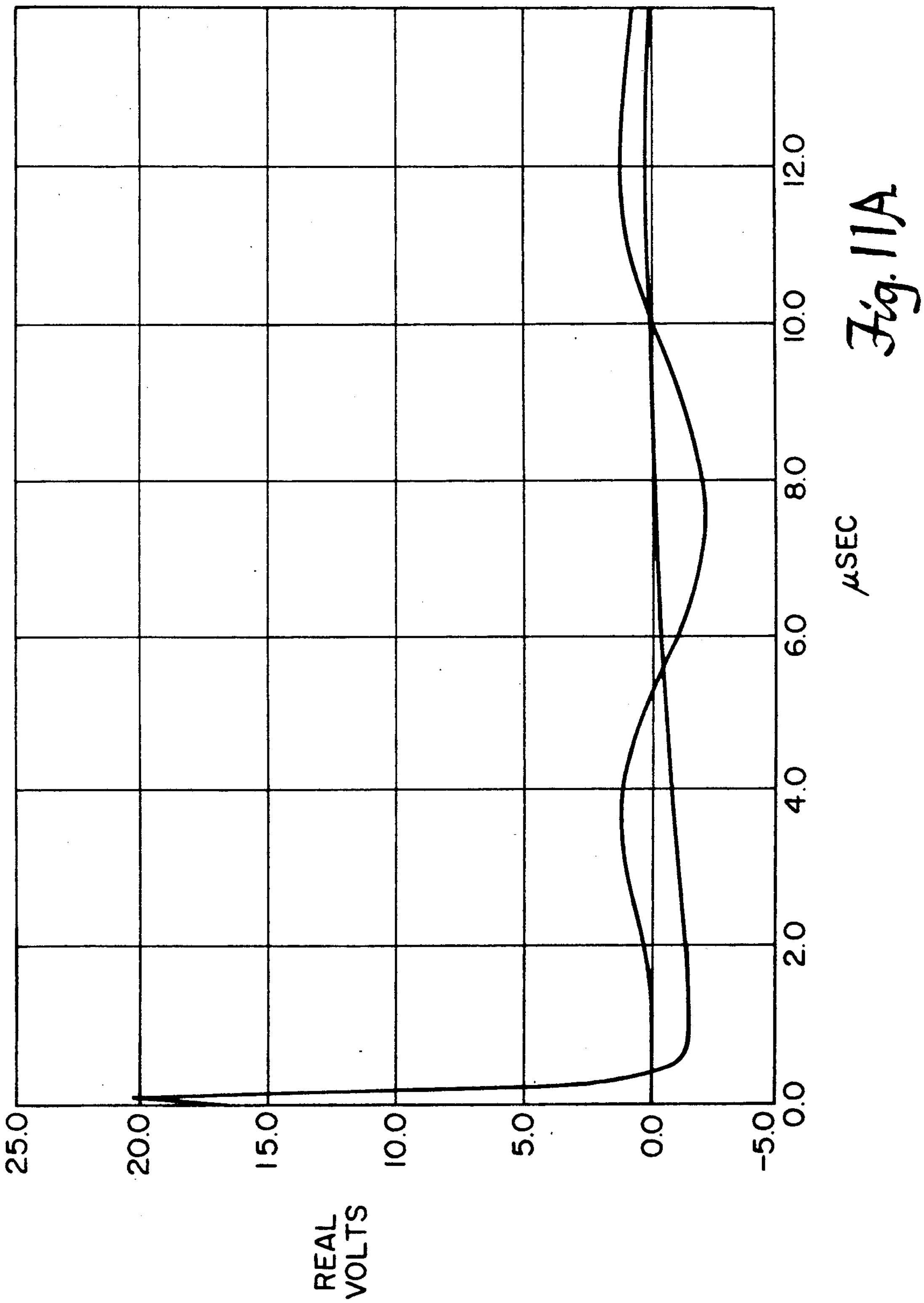
FIG. 11A is a graphical representation of the transient response of the embodiment of FIGS. 7-9 compared with that of an acoustic suspension enclosure.

Referring to FIG. 11A, there is shown a graphical representation of impulse transient response of a prior art acoustic suspension system and the impulse transient response of the invention. The added time delay in the reproduction of the signal is particularly useful for non-localizable bass output components in multiple speaker configurations in which the desired sonic imaging is to be controlled by the higher frequency components of those multiple speaker configurations.

Figure 13:
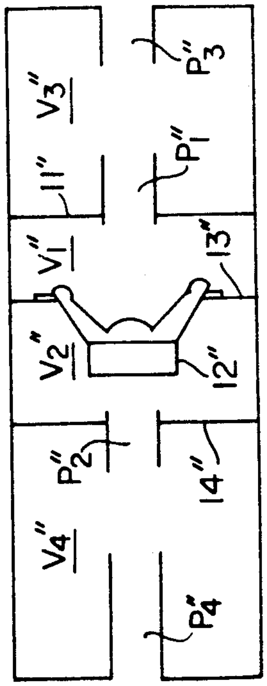
FIG. 13 is a simplified cross section of the embodiment of FIG. 12.
Figure 12:
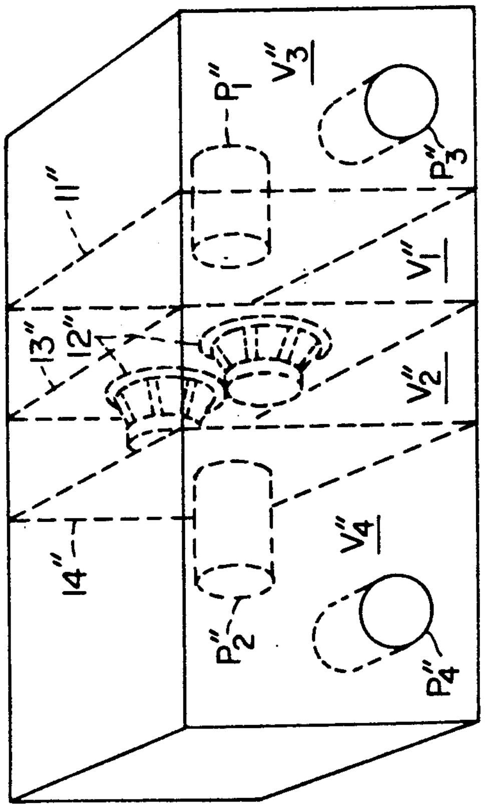
FIG. 12 is a pictorial perspective view of another embodiment of the invention.

Referring to FIGS. 12 and 13, there are shown pictorial perspective and simplified cross section views of another embodiment of the invention. In this embodiment, a second driving wall 11" separates both the first internal subchamber V1" from a third subchamber V3" and carries a passive radiator means P1" intercoupling the first internal and third subchambers. A third dividing wall 14" separates the second internal subchamber from a fourth subchamber, and carries a passive radiator means intercoupling the second internal and fourth subchambers. The third and fourth subchambers each has an exterior wall which carries a passive radiator or port means P3" and P4", respectively, for radiating acoustic energy to the region outside the enclosure.

Figure 14:
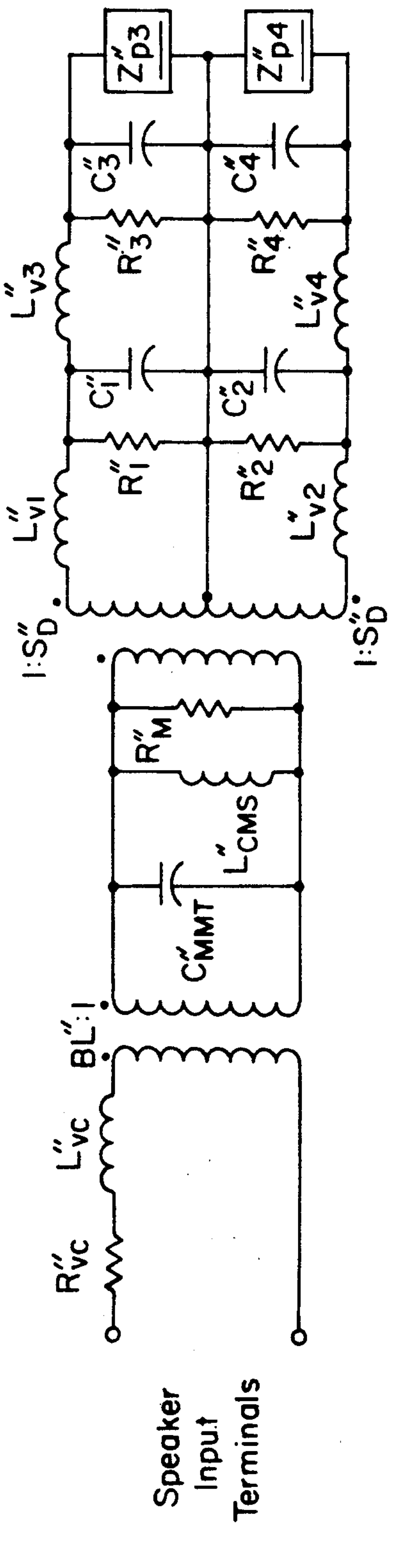
FIG. 14 is a schematic electrical circuit analog diagram of the embodiment of FIGS. 11-13.

Referring to FIG. 14, there is shown an electrical circuit analog schematic diagram of the embodiment of FIGS. 12 and 13. Exemplary parameter values follow:

2.79 ohms $=$ Rvc $=$ resistance of the voice coil of the driving transducer
0.001 henries $=$ Lvc $=$ inductance of the voice coil of the driving transducer
11.88 nt./amp. $=$ BL $=$ product of flux density in the voice coil gap and the length of voice coil wire in that gap
0.042 kg $=$ Cmmt $=$ moving mass of the cone/voice coil
0.00027 M/nt. $=$ Lcms $=$ suspension compliance of the transducer
0.288 M/nt.-sec. $=$ Rm $=$ inverse of loss (mobility) of mechanical moving system, mechanical mhos.
0.0242 $m^2=S_o=$ area of electroacoustical transducer diaphragm
$0.263\times 10^{-7} m^5/nt=L_{v1}=$ acoustic compliance of volume V1 (0.00368$m^3$)
$0.335\times 10^{-7} m^5/nt=L_{v2}=$ acoustic compliance of volume V2 (0.0047$m^3$)
$1.762\times 10^{-7} m^5/nt=L_{v3}=$ acoustic compliance of volume V3 (0.0171$m^3$)
$1.0\times 10^{-7} m^5/nt=L_{v4}=$ acoustic compliance of volume V3 (0.014$m^3$)
85.1 kg/$m^4=C_1=$ acoustic mass of port P1
29.7 kg/$m^4=C_2=$ acoustic mass of port P2
41.44 kg/$m^4=C_3=$ acoustic mass of port P3
137.5 kg/$m^4=C_4=$ acoustic mass of port P4
0.0035 $m^5$/nt sec. $=R_1=$ acoustic mobility in port P1
0.0013 $m^5$/nt sec. $=R_2=$ acoustic mobility in port P2
0.0042 $m^5$/nt sec. $=R_3=$ acoustic mobility in port P3
0.01 $m^5$/nt sec. $=R_4=$ acoustic mobility in port P4

$$12.8 \times 10^{-6} + \frac{1}{j\omega 4.6} = Z_{p3} = \text{radiation impedance seen by port } P3$$

$$12.8 \times 10^{-6} + \frac{1}{j\omega 4.6} = Z_{p4} = \text{radiation impedance seen by port } P4$$

Figure 15:
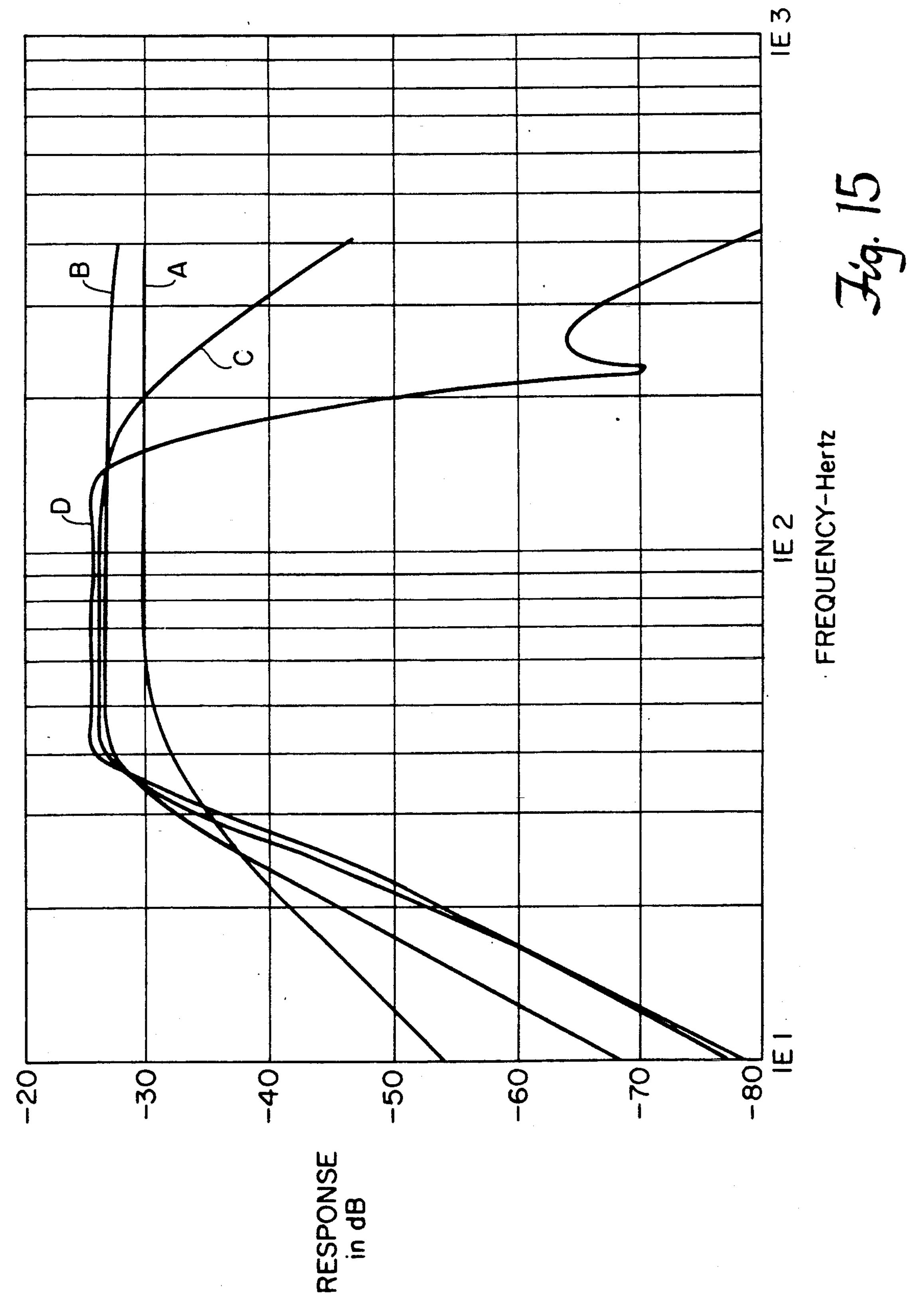
FIG. 15 is the output power frequency response of the embodiment of FIGS. 12-14 compared with the responses of other enclosures.
Figure 16:
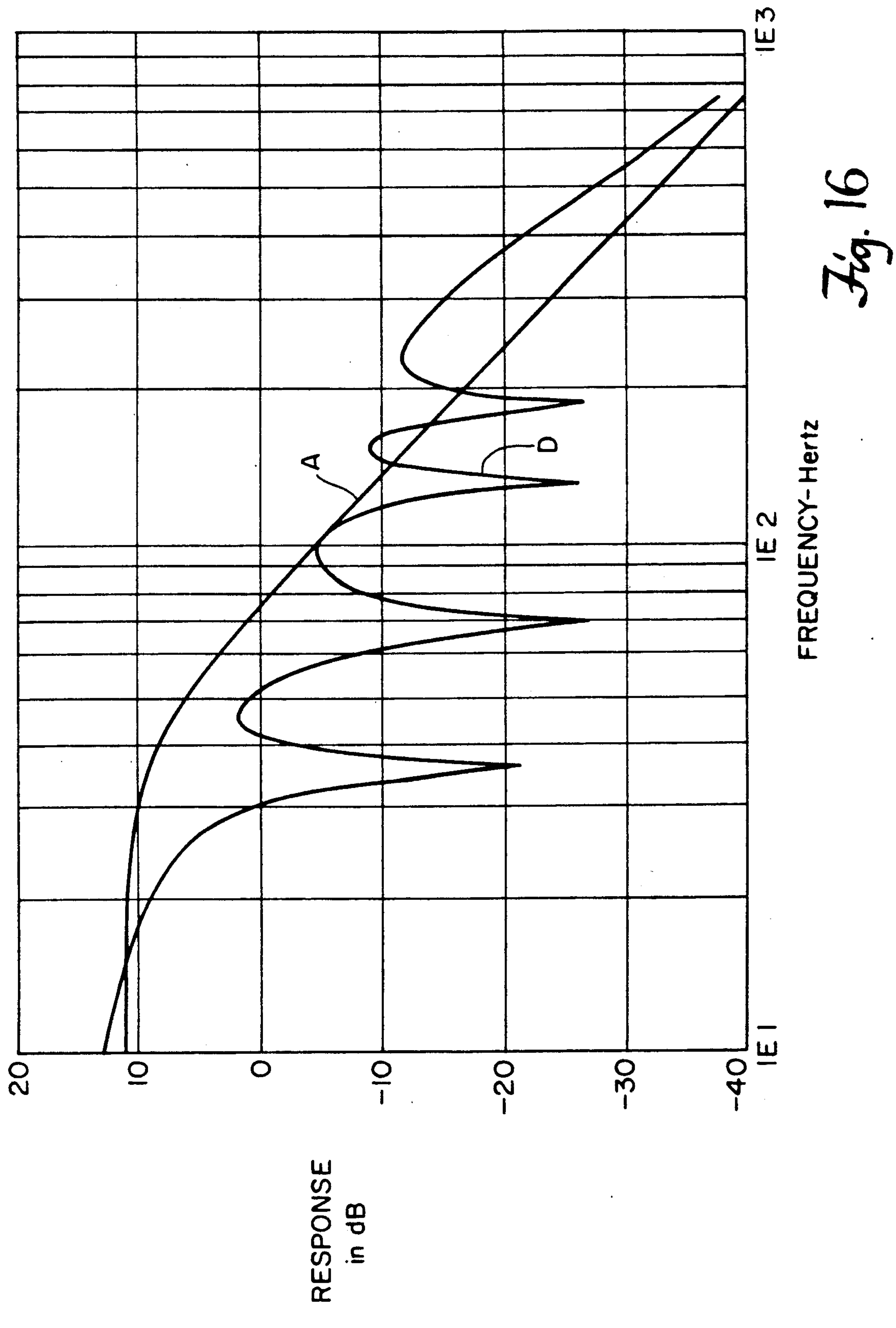
FIG. 16 is a graphical representation of diaphragm displacement as a function of frequency for the embodiment of FIGS. 12-14 compared with that of an acoustic suspension enclosure.
Figure 17:
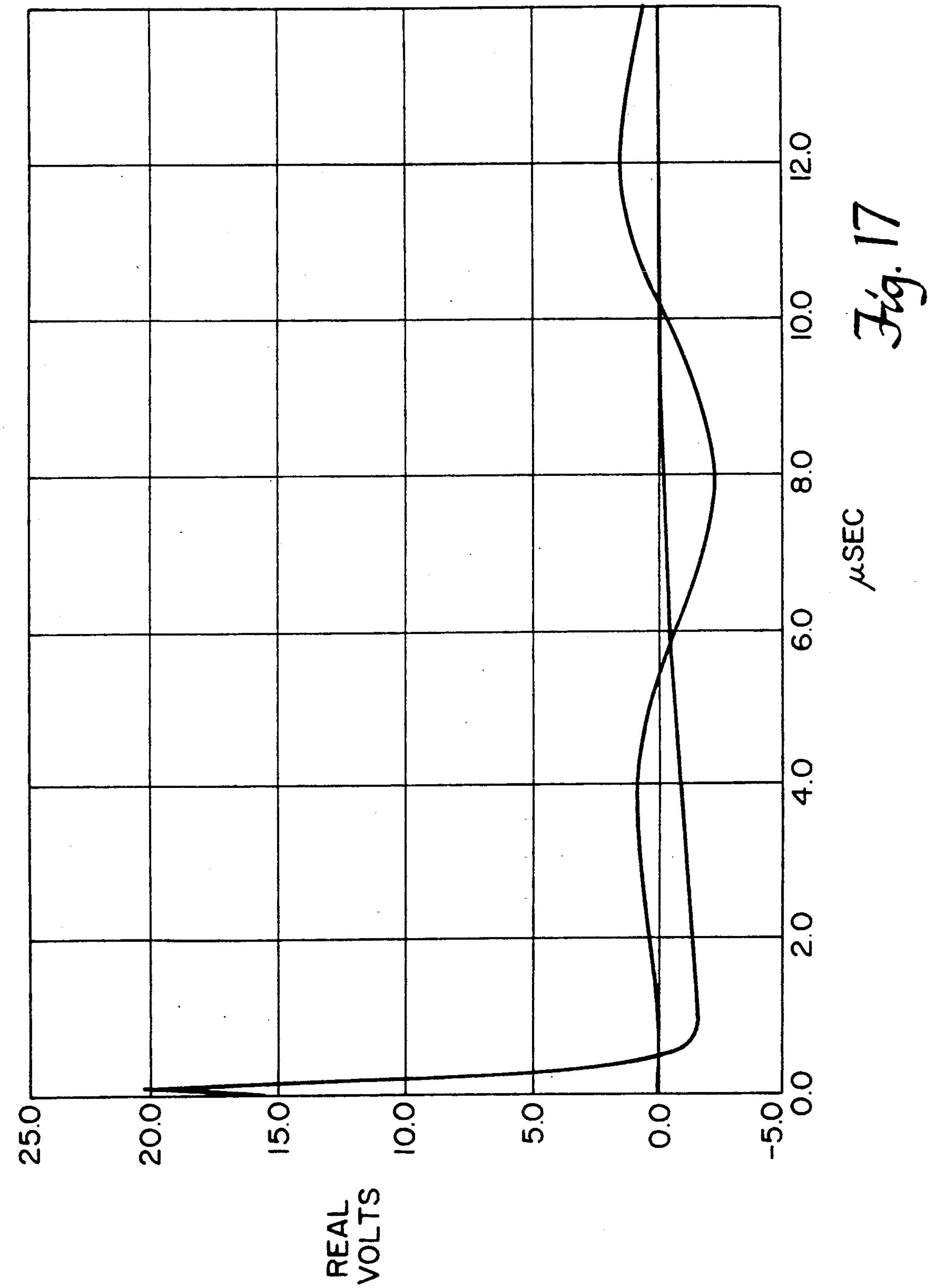
FIG. 17 is a graphical representation of the transient response of the embodiment of FIGS. 12-14 compared with that of an acoustic suspension enclosure.

Advantages of this four-subchamber configuration are shown in FIGS. 15, 16 and 17.

Referring to FIG. 15, there is shown the acoustic power radiated by an acoustic suspension system as a function of frequency by curve A; a prior art ported system, by curve B; prior art (per Bose U.S. Pat. No. 4,549,631) dual ported system, by curve C; and this configuration, by curve D.

Each system has the same size woofer and the same total enclosure volume with the loudspeaker and port parameters having been appropriately optimized for each system by adjusting that system's elements to achieve flat frequency response. This configuration provides improved output in the bass region and a sharper cutoff at higher frequencies than any of these prior art enclosures.

Referring to FIG. 16, there is shown a graphical representation of cone displacement as a function of frequency for prior art acoustic suspension system, in curve A, and according to the invention, in curve D. Curve A shows that the cone excursion of the acoustic suspension speaker rises with decreasing frequency. Curve D shows that the four-subchamber configuration according to this invention has four resonances where the cone excursion is minimized. Thus, the overall cone excursion and thus, distortion, on bass frequency signals is lower in this configuration. The range of system enclosure parameters for this embodiment that may produce the flat response and benefits described above are:

$$1.5 \leqq \frac{V3}{V1}$$

$$1.5 \leqq \frac{V4}{V2}$$

$$1 \leqq \frac{V2 + V4}{V1 + V3} \leqq 4$$

$$0.8 \leqq \frac{C4}{C2} \quad \frac{C3}{C1} \leqq 1$$

$$0.8 \leqq \frac{C2 + C4}{C1 + C3}$$

Referring to FIG. 17, there is shown a graphical representation of impulse transient response of a prior art acoustic suspension system and the impulse transient response of the invention. The added time delay in the reproduction of the signal is particularly useful for non-localizable bass output components in multiple speaker configurations in which the desired sonic imaging is to be controlled by the higher frequency components of those multiple speaker configurations.

Figure 19:
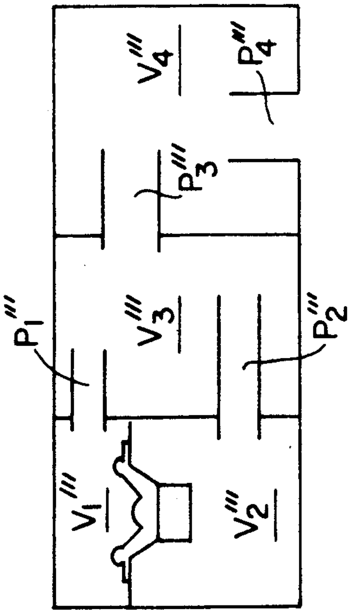
FIG. 19 is a simplified cross section of the embodiment of FIG. 18.
Figure 18:
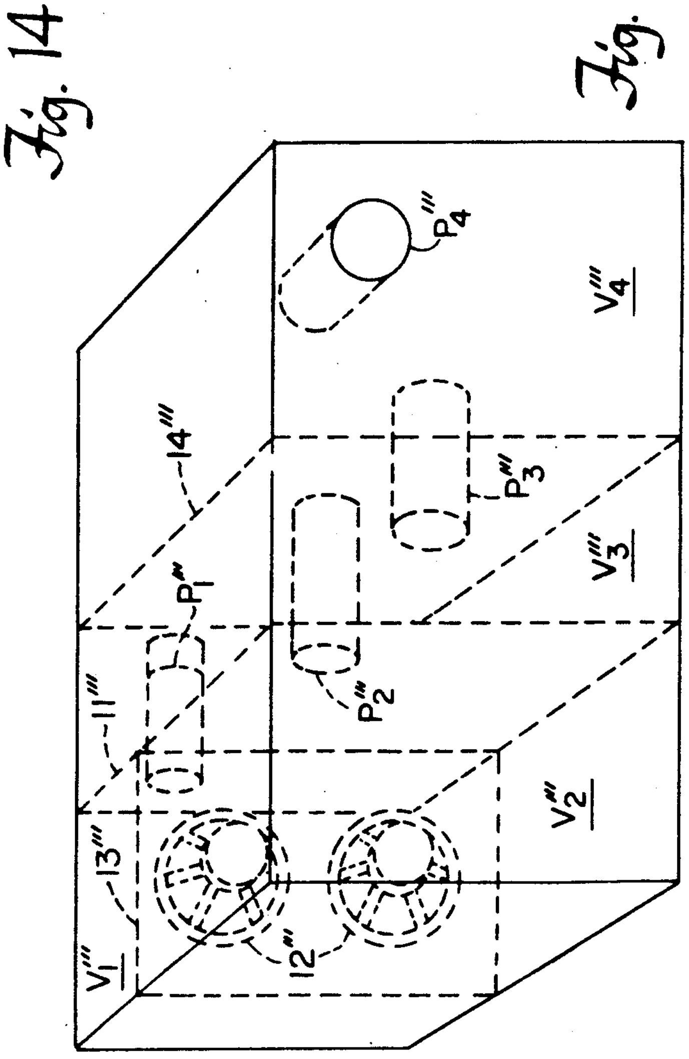
FIG. 18 is a perspective pictorial view of another embodiment of the invention.

Referring to FIGS. 18 and 19, there are shown pictorial perspective and simplified cross-section views of another embodiment of the invention. In this embodiment, a second dividing wall 11''' separates both the first V1''' and second V2''' internal subchambers from a third internal subchamber V3''' and carries two passive radiator means P1''' and P2''' each intercoupling the first internal and third internal subchambers and the second internal and third internal subchambers, respectively. A third dividing wall 14''' separates the third internal subchamber V3''' from a fourth subchamber V4''', and carries a passive radiator means P3''' intercoupling the third internal and fourth subchambers. The fourth subchamber V4''' has an exterior wall which carries a passive radiator or port means P4''' for radiating acoustic energy to the region outside the enclosure.

Figure 20:
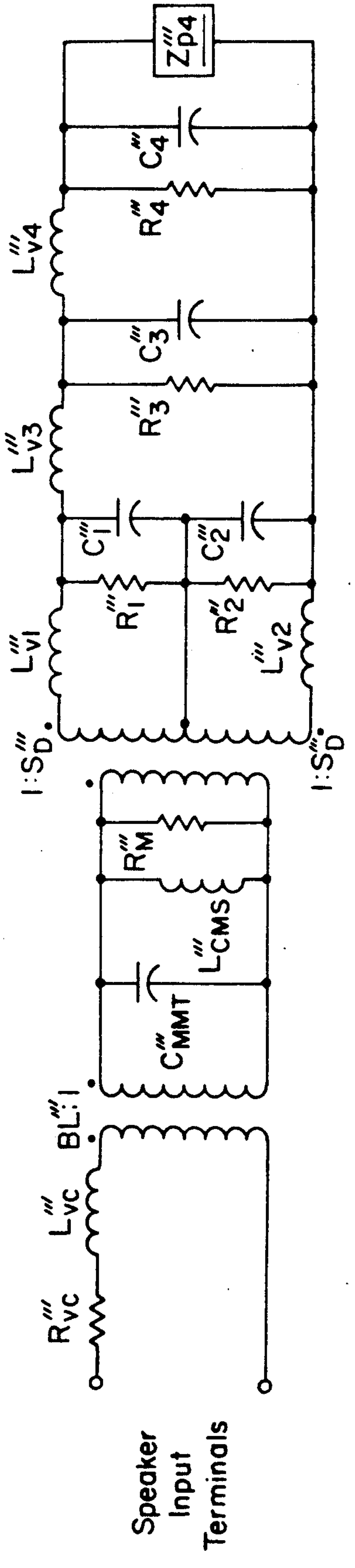
FIG. 20 is a schematic electrical circuit analog diagram of the embodiment of FIGS. 18 and 19.

Referring to FIG. 20, there is shown an electrical circuit analog circuit diagram of the embodiment of FIGS. 18 and 19. Exemplary parameter values for this embodiment follows:

- 2.79 ohms = Rvc''' = resistance of the voice coil of the driving transducer
- 0.00102 henries = Lvc''' = inductance of the voice coil of the driving transducer
- 13.68 nt./amp. = BL''' = product of flux density in the voice coil gap and the length of voice coil wire in that gap
- 0.03314 kg = Cmmt''' = moving mass of the cone/voice coil
- 0.00028 M/nt. = Lcms''' = suspension compliance of the transducer
- 0.255 M/nt.-sec. = Rm''' = inverse of loss (mobility) of mechanical moving system, mechanical mhos.
- 0.0242 $m^2 = S_o'''$ = area of electroacoustical transducer diaphragm
- $0.099 \times 10^{-7} m^5/nt = L_{v1}'''$ = acoustic compliance of volume V1''' ($0.001387 m^3$)
- $0.42 \times 10^{-7} m^6/nt = L_{v2}'''$ = acoustic compliance of volume V2''' ($0.00588 m^3$)

- $0.601 \times 10^{-7} m/nt = L_{v3}'''$ = acoustic compliance of volume V3''' ($0.008414 m^3$)
- $1.24 \times 10^{-7} m^5/nt = L_{v4}'''$ = acoustic compliance of volume V4''' ($0.01736 m^3$)
- 94.7 $kg/m^4 = C_1'''$ = acoustic mass of port P1'''
- 335 $kg/m^4 = C_2'''$ = acoustic mass of port P2'''
- 41.4 $kg/m^4 = C_3'''$ = acoustic mass of port P3'''
- 31.2 $kg/m^4 = C_4'''$ = acoustic mass of port P4'''
- 0.0015 $m^5$/nt sec. $= R_1'''$ = acoustic mobility in port P1'''
- 0.005 $m^5$/nt sec. $= R_2'''$ = acoustic mobility in port P2'''
- 0.002 $m^5$/nt sec. $= R_3'''$ = acoustic mobility in port P3'''
- 0.008 $m^5$/nt sec. $= R_4'''$ = acoustic mobility in port P4'''

$$12.8 \times 10^{-6} + \frac{1}{j\omega 4.6} = Z_{P4}''' = \text{radiation impedance seen by port } P4'''$$

Figure 21:
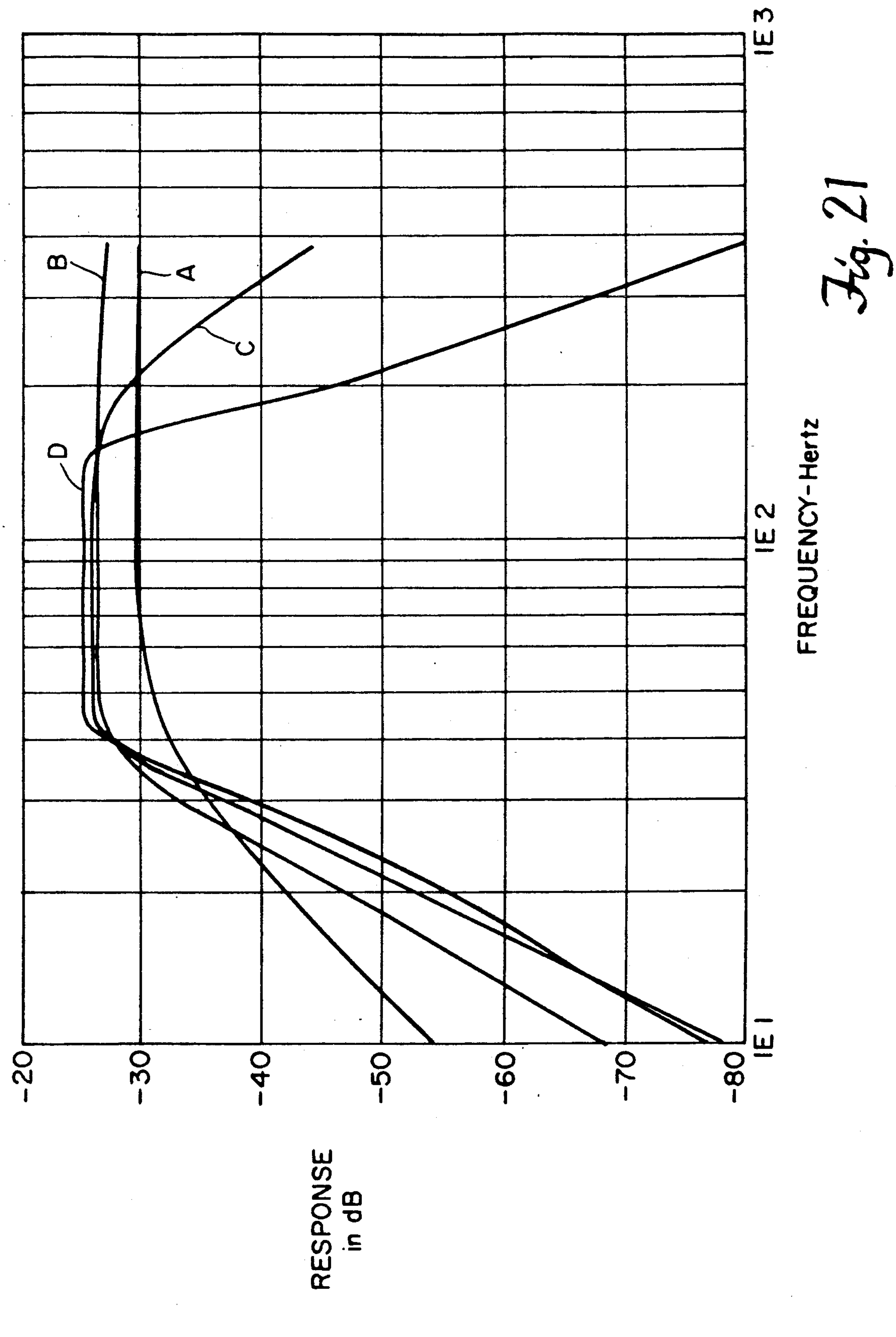
FIG. 21 is the output power frequency response of the embodiment of FIGS. 18-20 compared with other enclosures.
Figure 22:
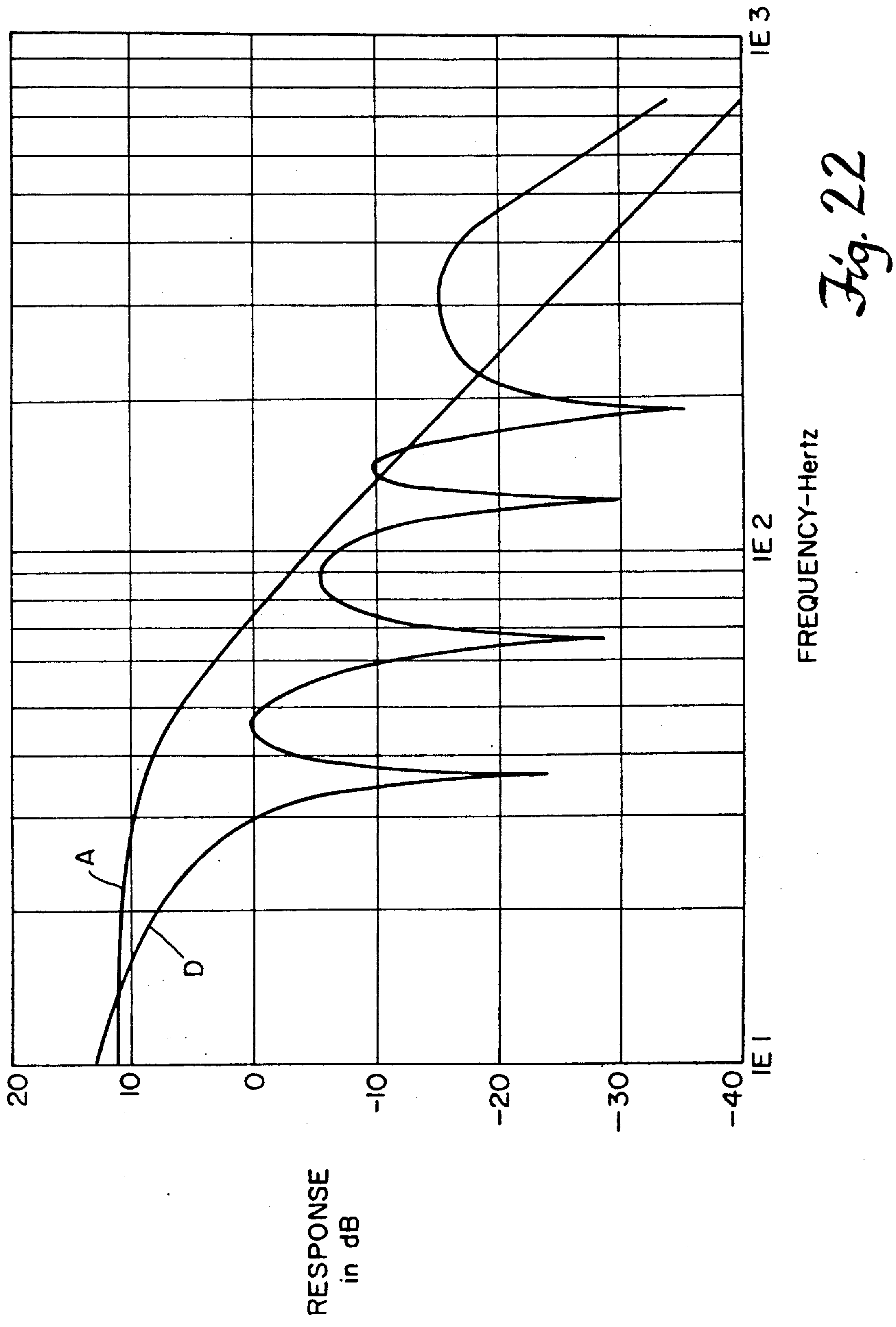
FIG. 22 is a graphical representation of diaphragm displacement as a function of frequency for the embodiment of FIGS. 18-20 compared with that of an acoustic suspension enclosure.
Figure 23:
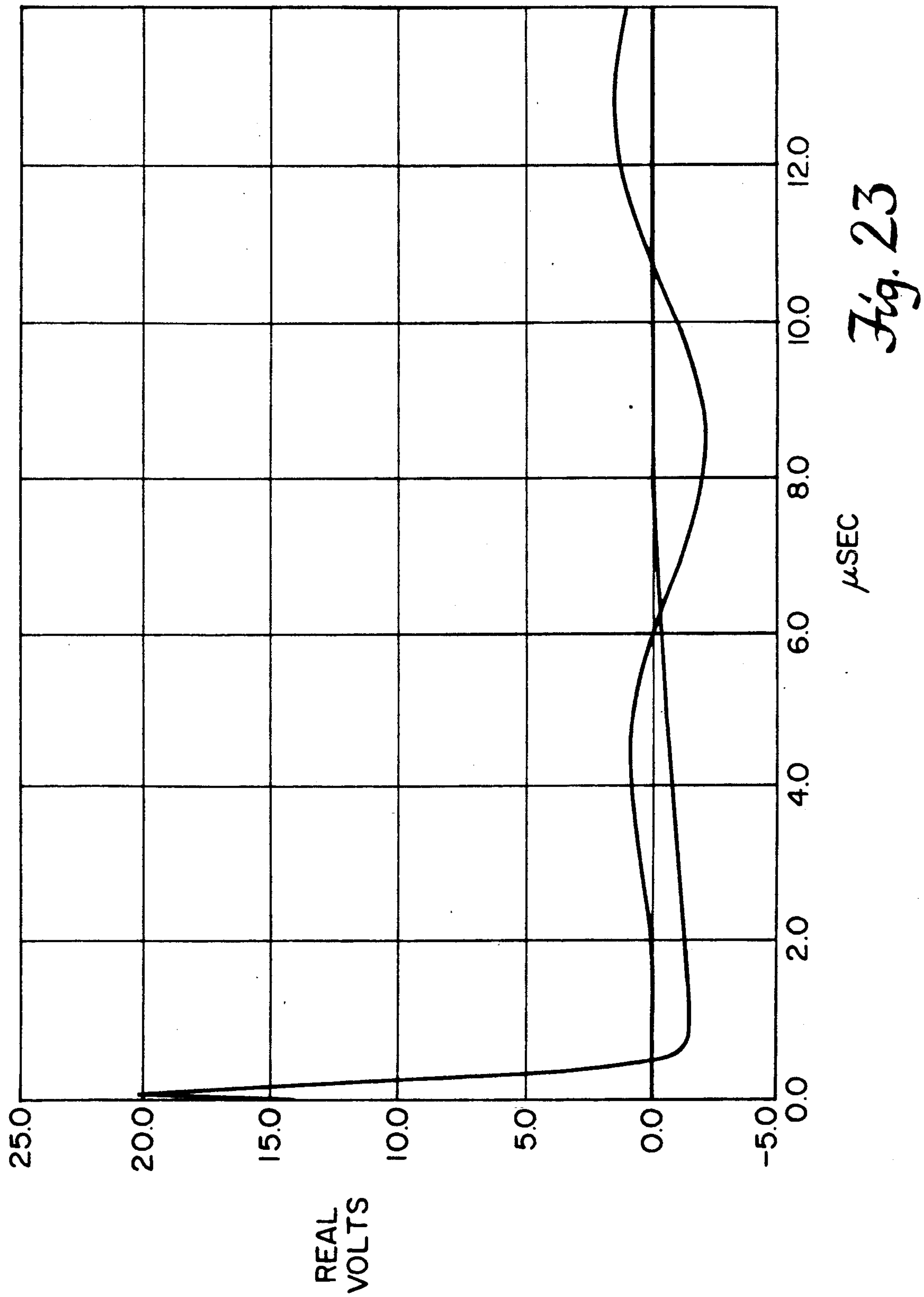
FIG. 23 is a graphical representation of the transient response of the embodiment of FIGS. 18-20 compared with that of an acoustic suspension enclosure.

Advantages of this four-subchamber configuration are shown in FIGS. 21-23.

Referring to FIG. 21, there is shown the acoustic power radiated by an acoustic suspension system as a function of frequency by curve A; a prior art ported system, by curve B; prior art (per Bose U.S. Pat. No. 4,549,631) dual ported system, by curve C; and this configuration, by curve D.

Each system has the same size woofer and the same total enclosure volume with the loudspeaker and port parameters having been appropriately optimized for each system by adjusting that system's elements to achieve flat frequency response. This configuration provides improved output in the bass region and a sharper cutoff at higher frequencies than any of these prior art enclosures.

Referring to FIG. 22, there is shown a graphical representation of cone displacement as a function of frequency for a prior art acoustic suspension system, in curve A, and according to the invention, in curve D. Curve A shows that the cone excursion of the acoustic suspension speaker rises with decreasing frequency. Curve D shows that the four-subchamber configuration according to this invention has four resonances where the cone excursion is minimized. Thus, the overall cone excursion and thus, distortion, on bass frequency signals is lower in this configuration. The range of system enclosure parameters for this embodiment that may produce the flat response and benefits described above:

$$1.5 \leqq \frac{V2}{V1}$$

$$0.8 \leqq \frac{V4}{V3} \leqq 4$$

$$1.5 \leqq \frac{V3 + V4}{V1 + V2}$$

$$2 \leqq \frac{C2}{C1}$$

$$0.5 \leqq \frac{C4}{C3} \leqq 3$$

$$2 \leqq \frac{C1 + C2}{C3 + C4}$$

Referring to FIG. 23, there is shown a graphical representation of impulse transient response of a prior art acoustic suspension system and the impulse transient response of the invention. The added time delay in the reproduction of the signal is particularly useful for non-localizable bass output components in multiple speaker configurations in which the desired sonic imaging is to be controlled by the higher frequency components of those multiple speaker configurations.

Figure 25:
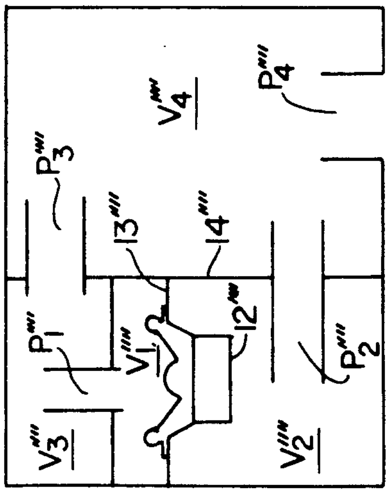
FIG. 25 is a simplified cross section of the embodiment of FIG. 24.
Figure 24:
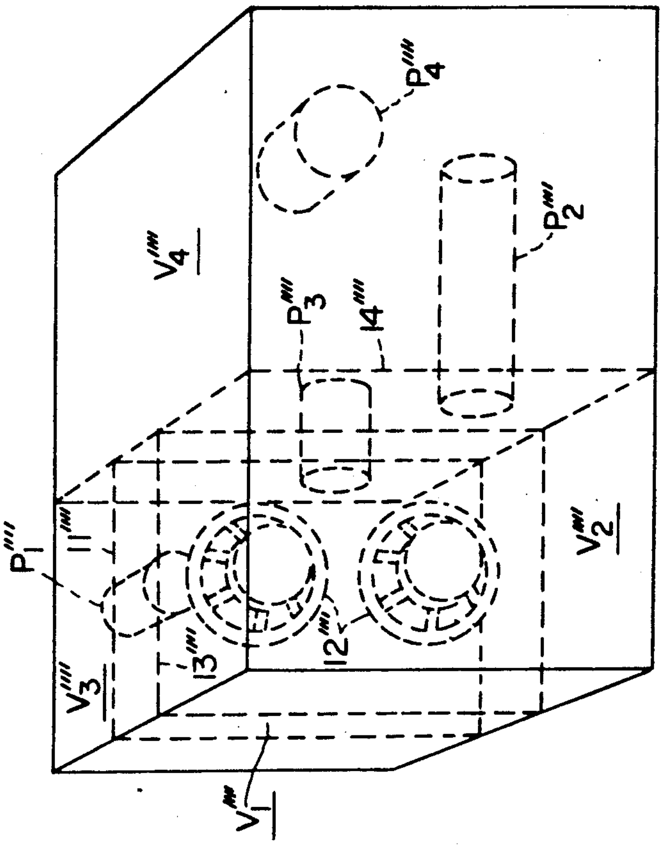
FIG. 24 is a perspective pictorial view of another embodiment of the invention.

Referring to FIGS. 24 and 25, there are shown perspective pictorial and simplified cross-section views of another embodiment of the invention. In this embodiment, a second dividing wall 11'''' separates the first internal subchamber V1'''' from a third internal subchamber V3'''' and carries a passive radiator means P1'''' intercoupling the first internal and third internal subchambers. A third dividing wall 14'''' separates the first V1'''', the second V2'''' and third V3'''' subchambers from a fourth subchamber V4'''', and carries two passive radiator means P2'''' and P3'''' intercoupling the second internal and fourth subchambers and the third internal and fourth subchambers, respectively. The fourth subchamber V4'''' has an exterior wall which carries a passive radiator or port means P4'''' for radiating acoustic energy to the region outside the enclosure.

Figure 26:
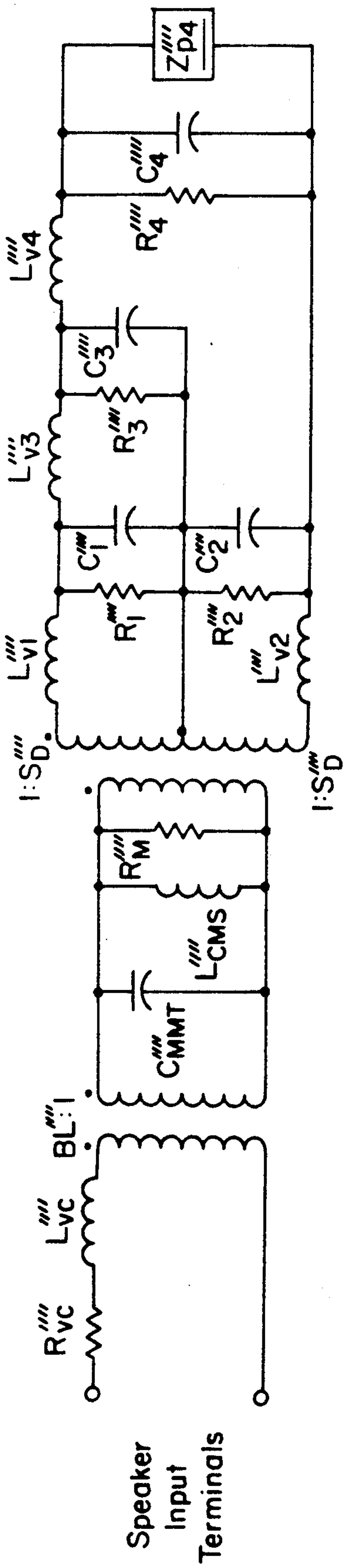
FIG. 26 is a schematic electrical circuit analog diagram of the embodiment of FIGS. 24 and 25.

Referring to FIG. 26, there is shown an electrical circuit analog schematic circuit diagram of the embodiment of FIGS. 24 and 25. Exemplary parameter values follow:

2.79 ohms=Rvc''''=resistance of the voice coil of the driving transducer 0.00097 henries=Lvc''''=inductance of the voice coil of the driving transducer 14.24 nt./amp.=BL''''=product of flux density in the voice coil gap and the length of voice coil wire in that gap 0.0374 kg=Cmmt''''=moving mass of the cone/-voice coil 0.0001794 M/nt.=Lcms''''=suspension compliance of the transducer 0.288 M/nt.-sec.=Rm''''=inverse of loss (mobility) of mechanical moving system, mechanical mhos.

0.0242 $m^2$=$S_o$''''=area of electroacoustical transducer diaphragm $0.088\times10^{-7}m^5/nt$=$L_{v1}$''''=acoustic compliance of volume V1'''' (0.00123$m^3$)

$0.6\times10^{-7}m^5/nt$=$L_{v2}$''''=acoustic compliance of volume V2'''' (0.0084$m^3$)

$0.428\times10^{-7}m^5/nt$=$L_{v3}$''''=acoustic compliance of volume V3'''' (0.006$m^3$)

$1.244\times10^{-7}m^5/nt$=$L_{v4}$''''=acoustic compliance of volume V4'''' (0.0174$m^3$)

116 kg/$m^4$=$C_1$''''=acoustic mass of port P1''''

269 kg/$m^4$=$C_2$''''=acoustic mass of port P2''''

50 kg/$m^4$=$C_3$''''=acoustic mass of port P3''''

32.2 kg/$m^4$=$C_4$''''=acoustic mass of port P4''''

0.003 $m^5$/nt sec.=$R_1$''''=acoustic mobility in port P1''''

0.008 $m^5$/nt sec.=$R_2$''''=acoustic mobility in port P2''''

0.003 $m^5$/nt sec.=$R_3$''''=acoustic mobility in port P3''''

0.008 $m^5$/nt sec.=$R^4$''''=acoustic mobility in port P4''''

$$12.8\times10^{-6}+\frac{1}{j\omega 4.6}=Z_{p4}''''=\text{radiation impedance seen by port } P4''''$$

Figure 27:
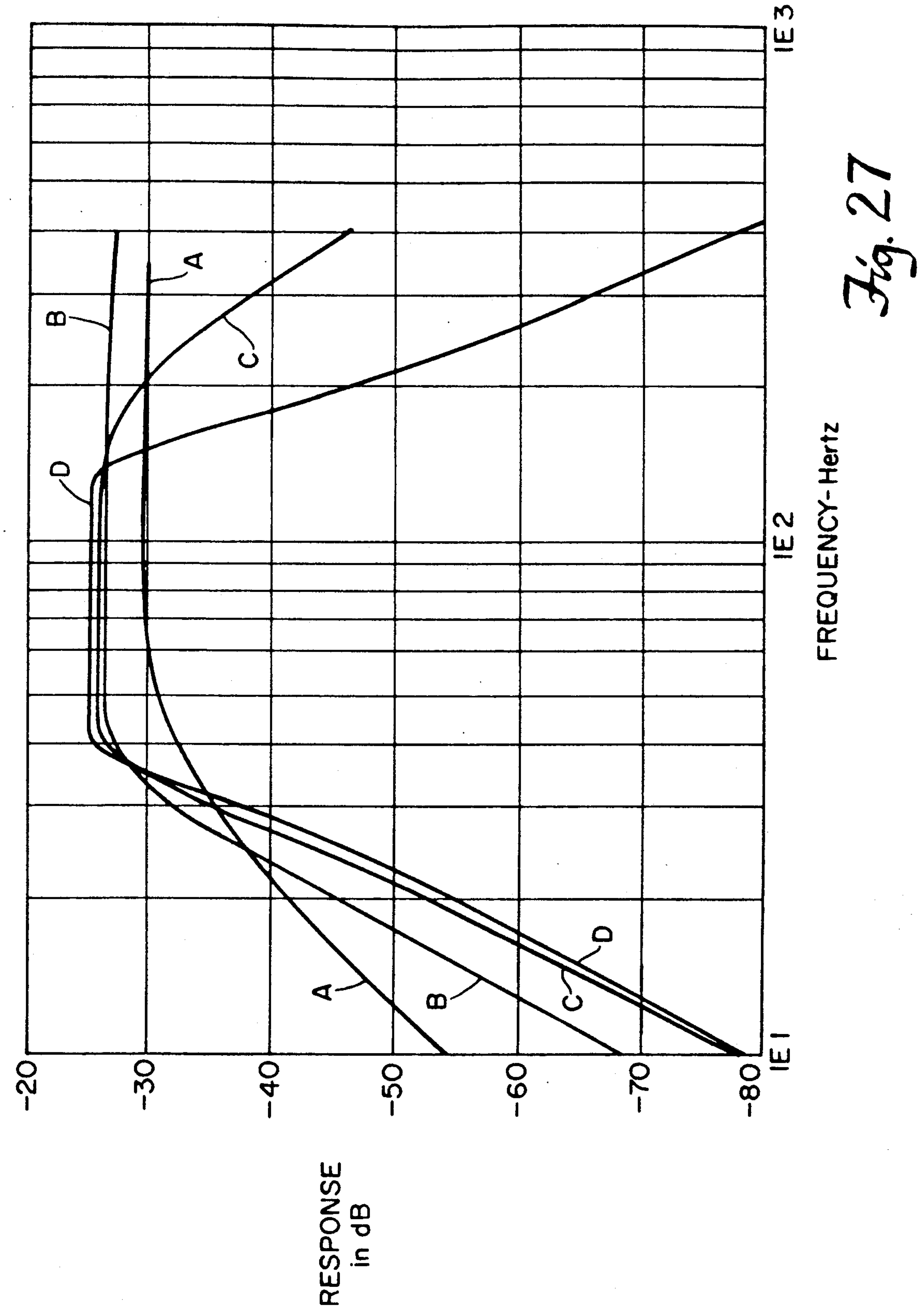
FIG. 27 is the output power frequency response of the embodiment of FIGS. 24-26 compared with that of other enclosures.

Referring to FIG. 27, there is shown the acoustic power radiated by an acoustic suspension system as a function of frequency by curve A; a prior art ported system, by curve B; prior art (per Bose U.S. Pat. No. 4,549,631) dual ported system, by curve C; and this configuration, by curve D.

Each system has the same size woofer and the same total enclosure volume with the loudspeaker and port parameters having been appropriately optimized for each system by adjusting that system's elements to achieve flat frequency response. This configuration provides improved output in the bass region and a sharper cutoff at higher frequencies than any of these prior art enclosures.

Figure 28:
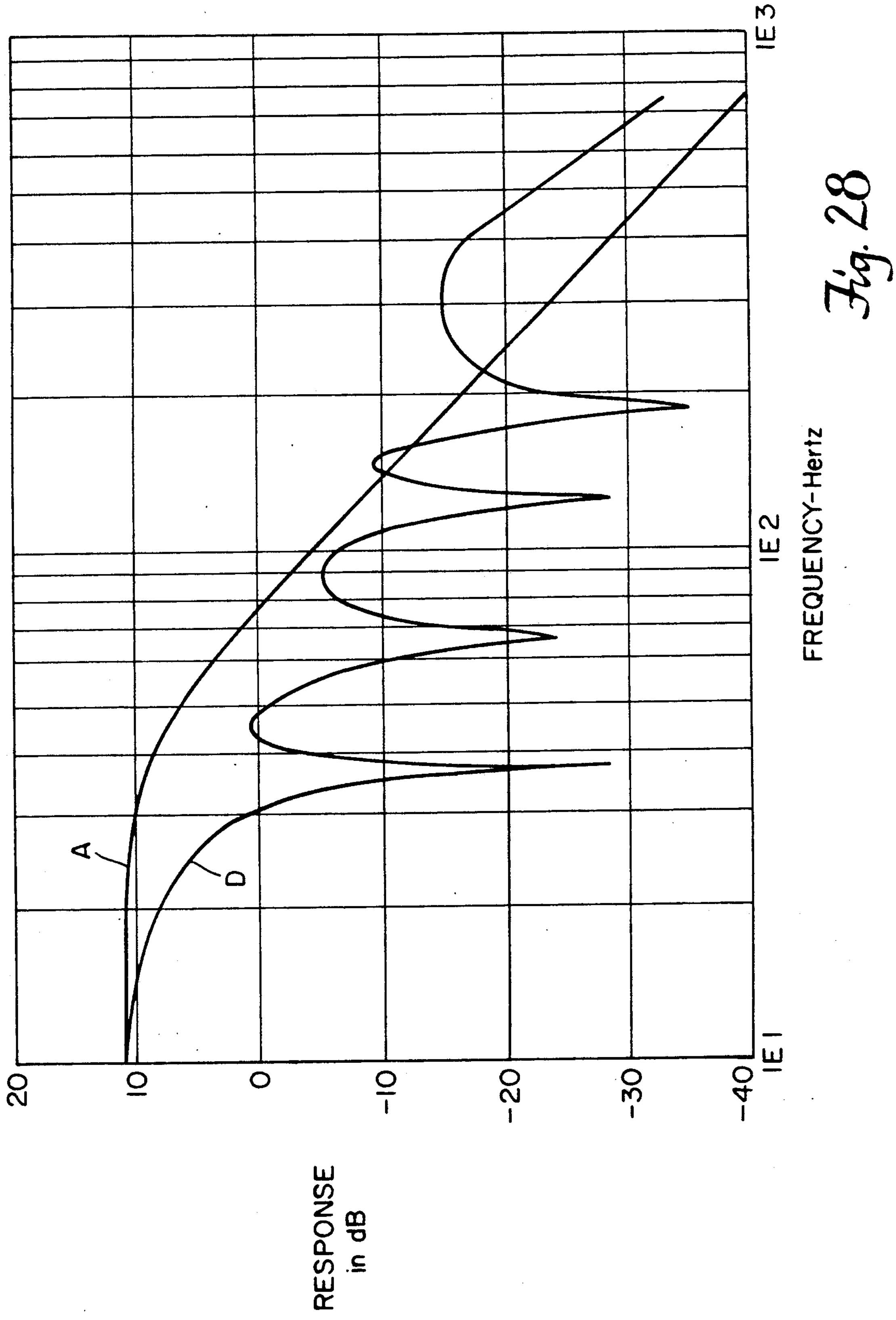
FIG. 28 is a graphical representation of diaphragm displacement of the embodiment of FIGS. 24-26 compared with an acoustic suspension enclosure.

Referring to FIG. 28, there is shown a graphical representation of cone displacement as a function of frequency for a prior art acoustic suspension system, in curve A, and according to the invention, in curve D. Curve A shows that the cone excursion of the acoustic suspension speaker rises with decreasing frequency. Curve D shows that the four-subchamber configuration according to this invention has four resonances where the cone excursion is minimized. Thus, the overall cone excursion and thus, distortion, on bass frequency signals is lower in this configuration. The range of system enclosure parameters for this embodiment that may produce the flat responses and benefits described above are:

$$1.5\leq\frac{V3}{V1}$$

$$0.5\leq\frac{V2}{V1+V3}\leq 2$$

$$0.5\leq\frac{V4}{V1+V2+V3}\leq 2$$

$$1.5\leq\frac{C1}{C3}\leq 6$$

$$1\leq\frac{C2}{C1+C3}\leq 4$$

$$4\leq\frac{C1+C2+C3}{C4}$$

Figure 29:
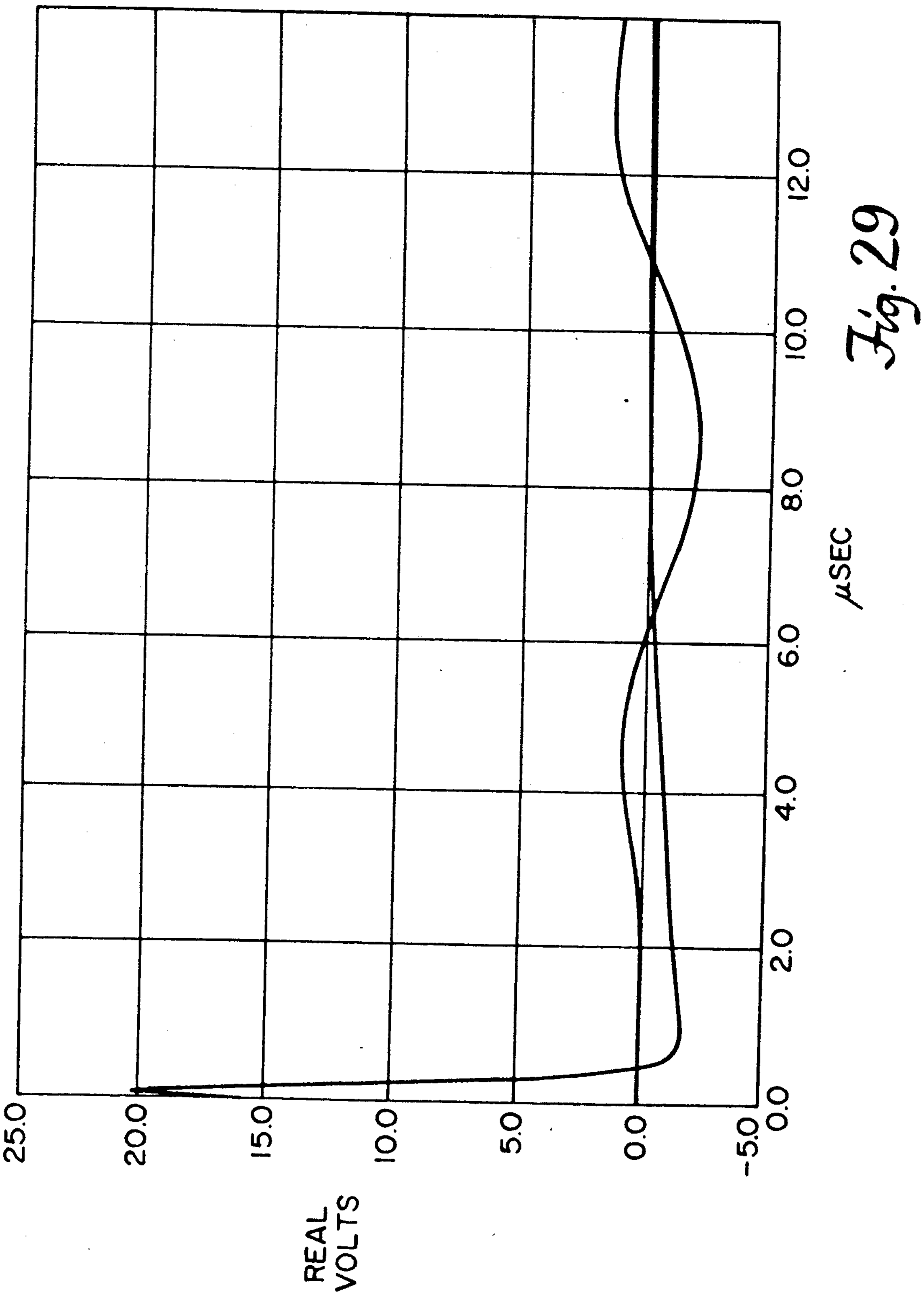
FIG. 29 is a graphical representation of the transient response of the embodiment of FIGS. 24-26 compared with that of an acoustic suspension enclosure.

Referring to FIG. 29, there is shown a graphical representation of impulse transient response of a prior art acoustic suspension system and the impulse transient response of the invention. The added time delay in the reproduction of the signal is particularly useful for non-localizable bass output components in multiple speaker configurations in which the desired sonic imaging is to be controlled by the higher frequency components of those multiple speaker configurations.

Figure 30:
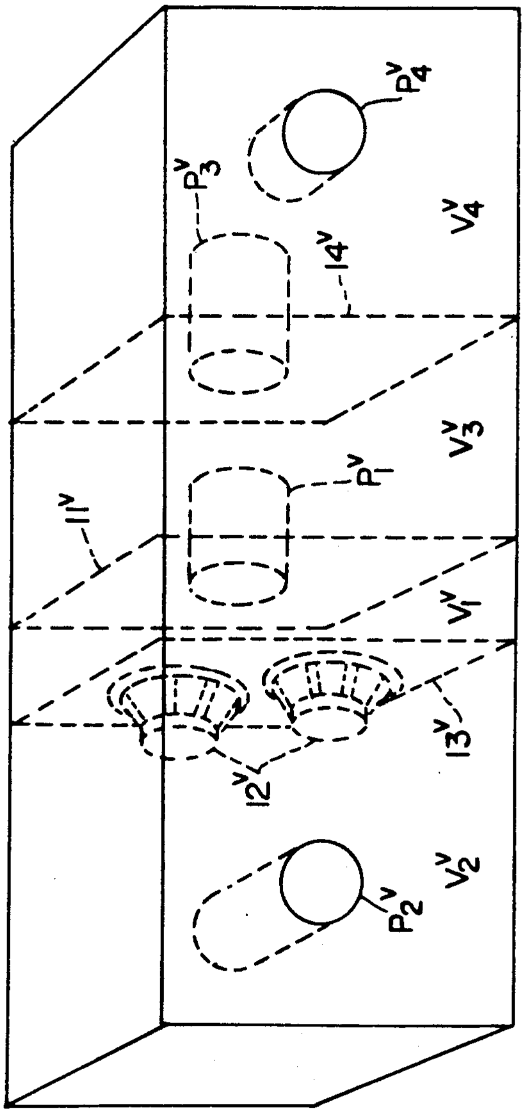
FIG. 30 is a perspective pictorial view of another embodiment of the invention.
Figure 31:
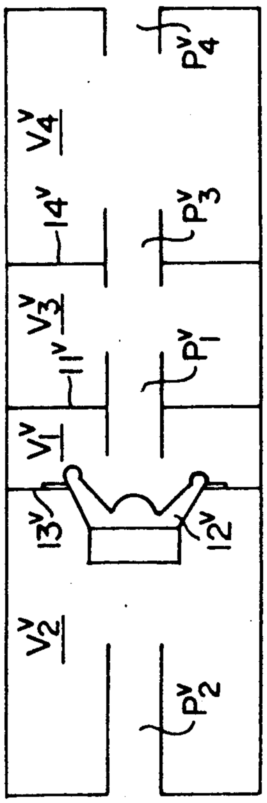
FIG. 31 is a simplified cross section of the embodiment of FIG. 30.

Referring to FIGS. 30 and 31, there are shown pictorial perspective and simplified cross-section views of another embodiment of the invention. In this embodiment, second dividing wall 11$^v$ separates the first internal subchamber V1$^v$ from a third internal subchamber V3$^v$ and carries a passive radiator means P1$^v$ intercoupling the first internal and third internal subchambers. A third dividing wall 14$^v$ separates the third internal subchamber V3$^v$ from a fourth subchamber V4$^v$ and carries a passive radiator means P3$^v$ intercoupling the third internal and fourth subchambers. The second and fourth subchambers each has an exterior wall which carries a passive radiator or port means P2$^v$ and P4$^v$, respectively, for radiating acoustic energy to the region outside the enclosure.

Figure 32:
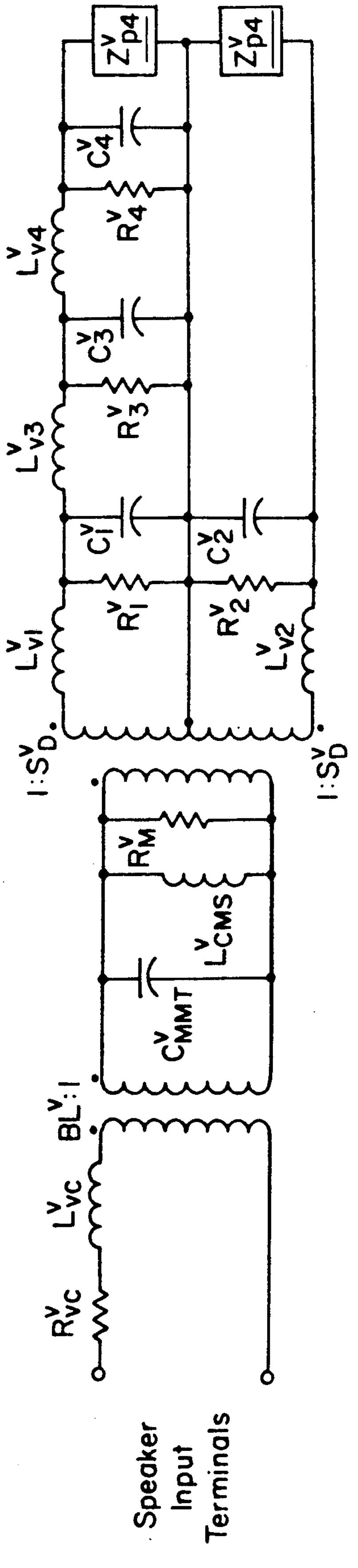
FIG. 32 is a schematic electrical circuit analog diagram of the embodiment of FIGS. 30 and 31.

Referring to FIG. 32, there is shown an electrical circuit analog schematic diagram of the embodiment of FIGS. 30 and 31. There follows exemplary parameter values for this embodiment.

2.79 ohms$=Rvc^{v}=$resistance of the voice coil of the driving transducer 0.00097 henries$=Lvc^{v}=$inductance of the voice coil of the driving transducer 19.98 nt./amp.$=BL^{v}=$product of flux density in the voice coil gap and the length of voice coil wire in that gap 0.0339 kg$=Cmmt^{v}=$moving mass of the cone/voice coil 0.00027 M/nt.$=Lcms^{v}=$suspension compliance of the transducer 0.288 M/nt.-sec.$=Rm^{v}=$inverse of loss (mobility) of mechanical moving system, mechanical mhos.

$0.0242m^2=s_o{}^{v}=$area of electroacoustical transducer diaphragm $0.098\times10^{-7}m^5/nt=L_{v1}{}^{v}=$acoustic compliance of volume $V1^1$ ($0.001372m^3$)

$1.15\times10^{-7}m^5/nt=L_{v2}{}^{v}=$acoustic compliance of volume $V1^v$ ($0.0161m^3$)

$0.302\times10^{-7}m/nt=L_{v3}{}^{v}=$acoustic compliance of volume $V3^v$ ($0.00428m^3$)

$0.81\times10^{-7}m^5/nt\rightarrow L_{v4}{}^{v}=$acoustic compliance of volume $V4^v$ ($0.01134m^3$)

$89.5\ kg/m^4=C_1{}^{v}=$acoustic mass of port $P1^v$ $163\ kg/m^4=C_2{}^{v}=$acoustic mass of port $P2^v$ $62\ kg/m^4=C_3{}^{v}=$acoustic mass of port $P3^v$ $38.5\ kg/m^4=C_4{}^{v}=$acoustic mass of port $P4^v$ $0.0017\ m^5/nt\ sec.=R_1{}^{v}=$acoustic mobility in port $P1^v$ $0.011\ m^5/nt\ sec.=R_2{}^{v}=$acoustic mobility in port $P2^v$ $0.0025\ m^5/nt\ sec.=R_3{}^{v}=$acoustic mobility in port $P3^v$ $0.0038\ m^5/nt\ sec.=R_4{}^{v}=$acoustic mobility in port $P4^v$ $$12.8\times10^{-6}+\frac{1}{j\omega 4.6}=Z^{v}_{p2}=\text{radiation impedance seen by port } P2^{v}$$

$$12.8\times10^{-6}+\frac{1}{j\omega 4.6}=Z^{v}_{p4}=\text{radiation impedance seen by port } P4^{v}$$

Figure 33:
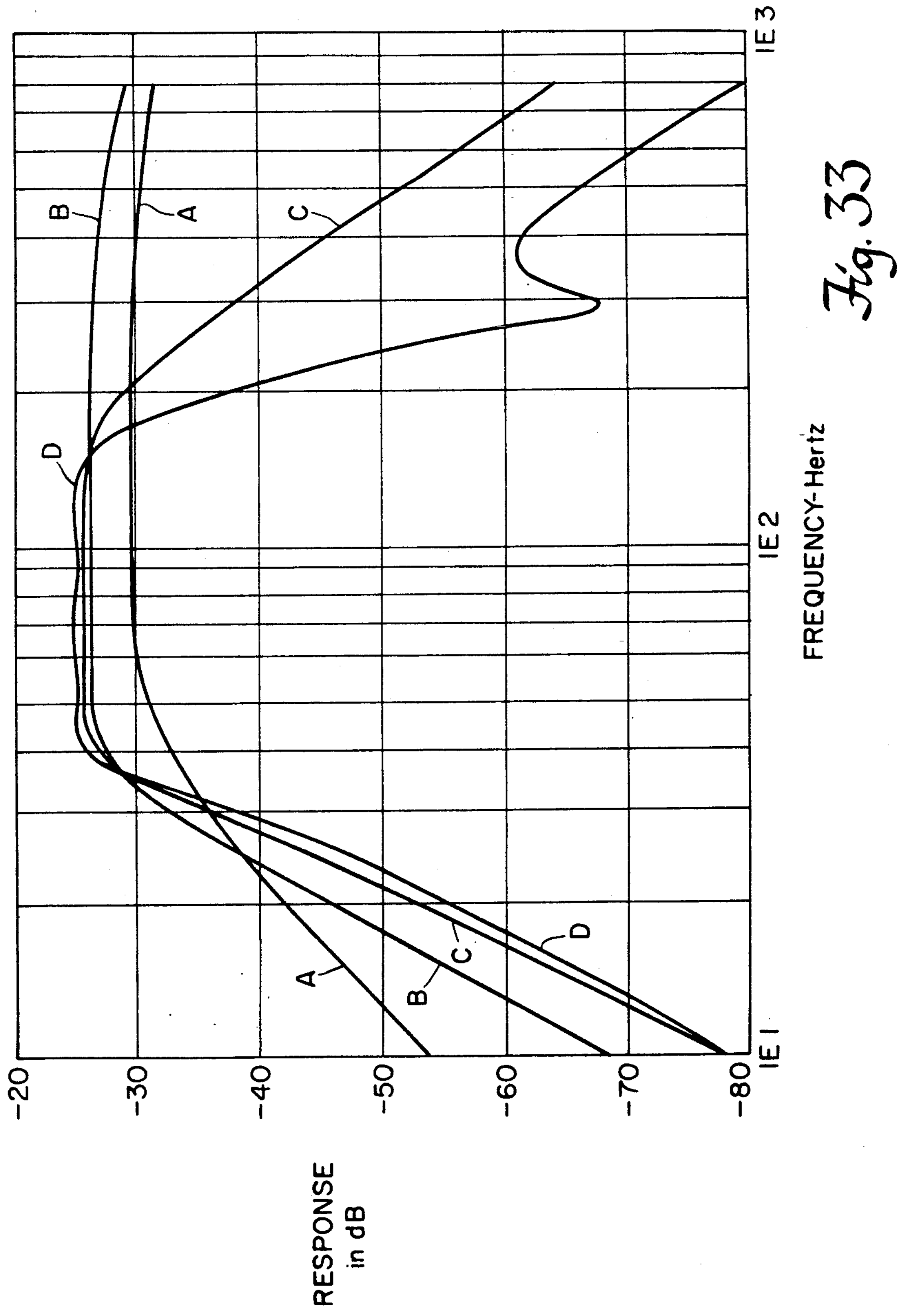
FIG. 33 is the output power frequency response of the embodiment of FIGS. 30-32 compared with that of other enclosures.
Figure 34:
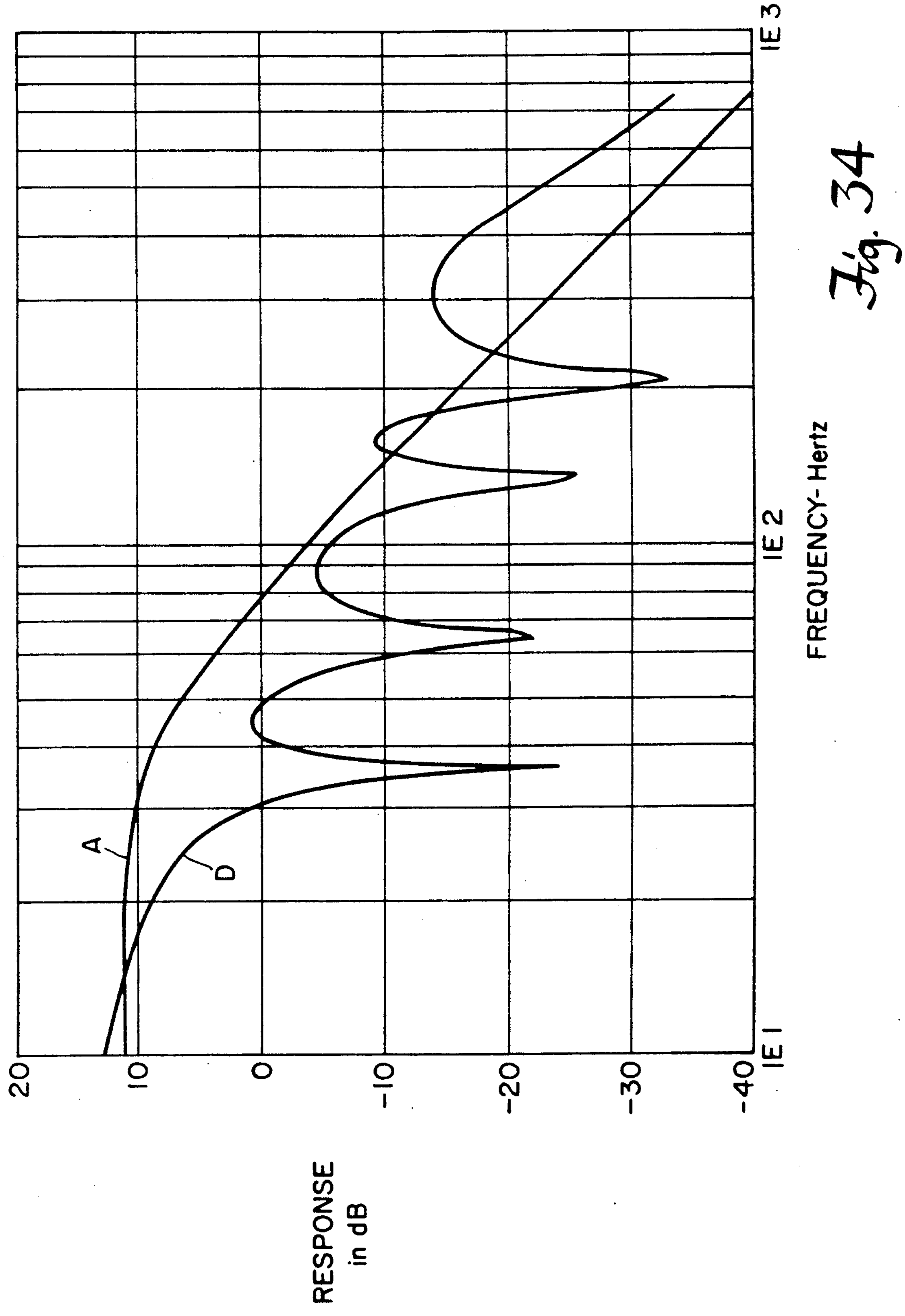
FIG. 34 is a graphical representation of diaphragm displacement as a function of frequency for the embodiment of FIGS. 30-32 compared with that of an acoustic suspension enclosure.
Figure 35:
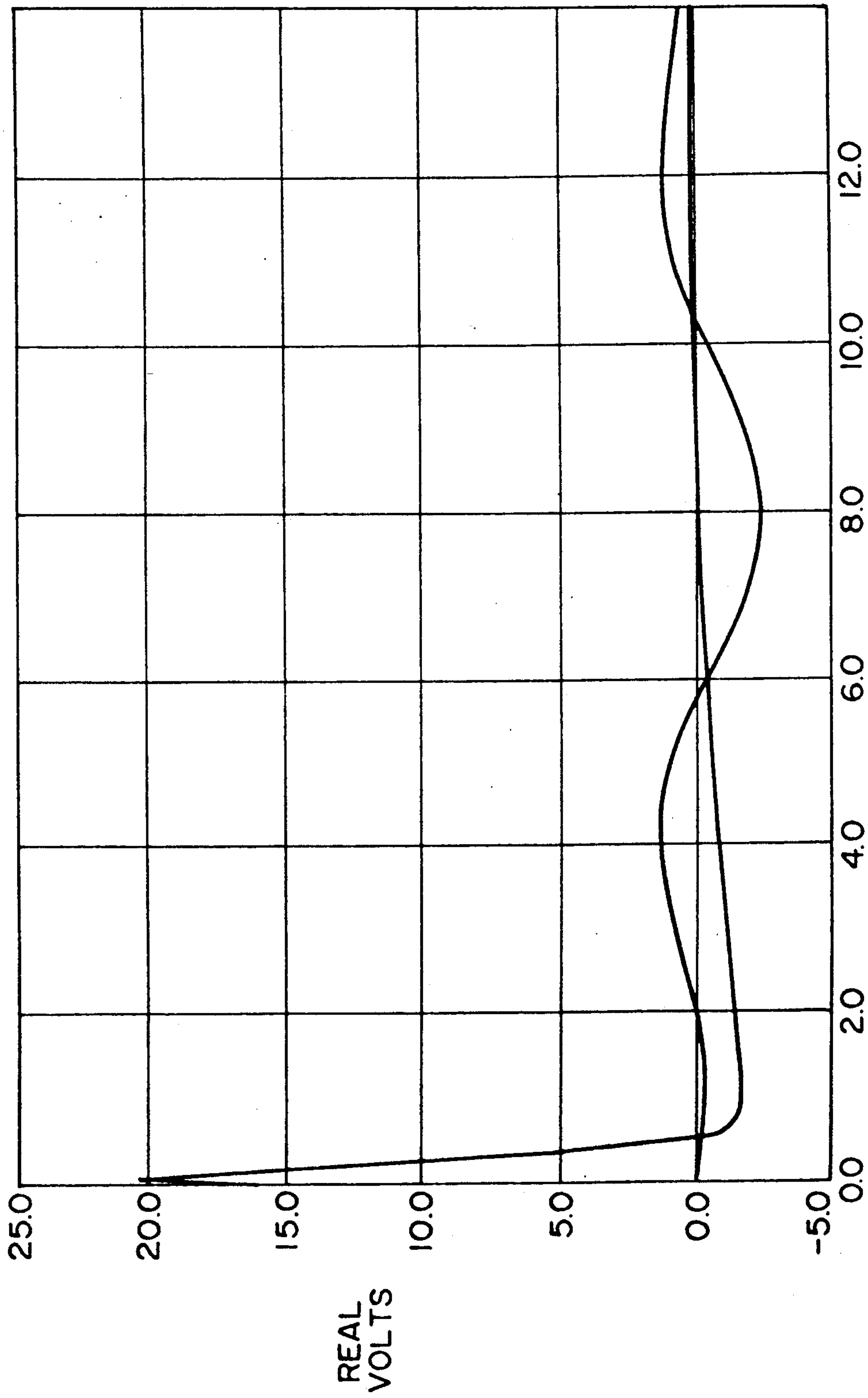
FIG. 35 is a graphical representation of the transient response of the embodiment of FIGS. 30-32 compared with that of an acoustic suspension enclosure.

Advantages of this four-subchamber configuration are shown in FIGS. 33–35.

Referring to FIG. 33, there is shown the acoustic power radiated by an acoustic suspension system as a function of frequency by curve A; a prior art ported system, by curve B; prior art (per Bose U.S. Pat. No. 4,549,631) dual ported system, by curve C; and this configuration, by curve D.

Each system has the same size woofer and the same total enclosure volume with the loudspeaker and port parameters having been appropriately optimized for each system by adjusting that system's elements to achieve flat frequency response. This configuration provides improved output in the bass region and a sharper cutoff at higher frequencies than any of these prior art enclosures.

Referring to FIG. 34, there is shown a graphical representation of cone displacement as a function of frequency for a prior art acoustic suspension system, in curve A, and according to the invention, in curve D. Curve A shows that the cone excursion of the acoustic suspension speaker rises with decreasing frequency. Curve D shows that the four-subchamber configuration according to this invention has four resonances where the cone excursion is minimized. Thus, the overall cone excursion and thus, distortion, on bass frequency signals is lower in this configuration.

The range of system enclosure parameters for this embodiment that may produce the flat response and benefits described above are:

$$1.5\leq\frac{V3}{V1}$$

$$1.5\leq\frac{V4}{V3}$$

$$0.5\leq\frac{V1+V3+V4}{V2}\leq 3$$

$$0.8\leq\frac{C1}{C3}\leq 4$$

$$0.8\leq\frac{C3}{C4}\leq 4$$

$$0.5\leq\frac{C1+C3+C4}{C2}\leq 3$$

Referring to FIG. 35, there is shown a graphical representation of impulse transient response of a prior art acoustic suspension system and the impulse transient response of the invention. The added time delay in the reproduction of the signal is particularly useful for non-localizable bass output components in multiple speaker configurations in which the desired sonic imaging is to be controlled by the higher frequency components of those multiple speaker configurations.

Figure 36:
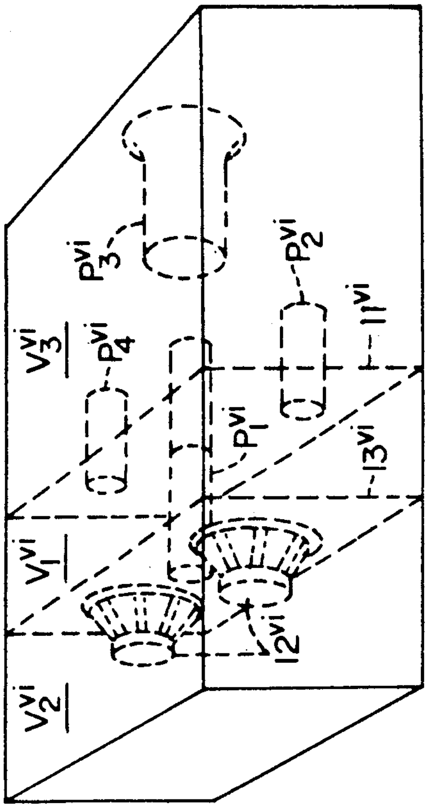
FIG. 36 is a perspective pictorial view of a commercial embodiment of the invention.

Referring to FIG. 36, there is shown a pictorial perspective view of a commercial embodiment of the invention that is a variation of the embodiment of FIGS. 7–11A. This embodiment of the invention includes a pair of woofers 12 mounted on intermediate panel $13^{vi}$. Intermediate panels $11^{vi}$ and $13^{vi}$ bound intermediate subchamber $V_1{}^{vi}$. Intermediate panels $13^{vi}$ and $11^{vi}$ bound end subchambers $V_3{}^{vi}$ and $V_2{}^{vi}$, respectively. Passive radiator $P_1{}^{vi}$ intercouples end subchambers $V_2{}^{vi}$ and $V_3{}^{vi}$. Passive radiator $P_2{}^{vi}$ intercouples intermediate subchamber $V_1{}^{vi}$ and end subchamber $V_3{}^{vi}$. Flared port tube passive radiator $P_3{}^{vi}$ couples end subchamber $V_3{}^{vi}$ with the region outside the enclosure.

Figure 37:
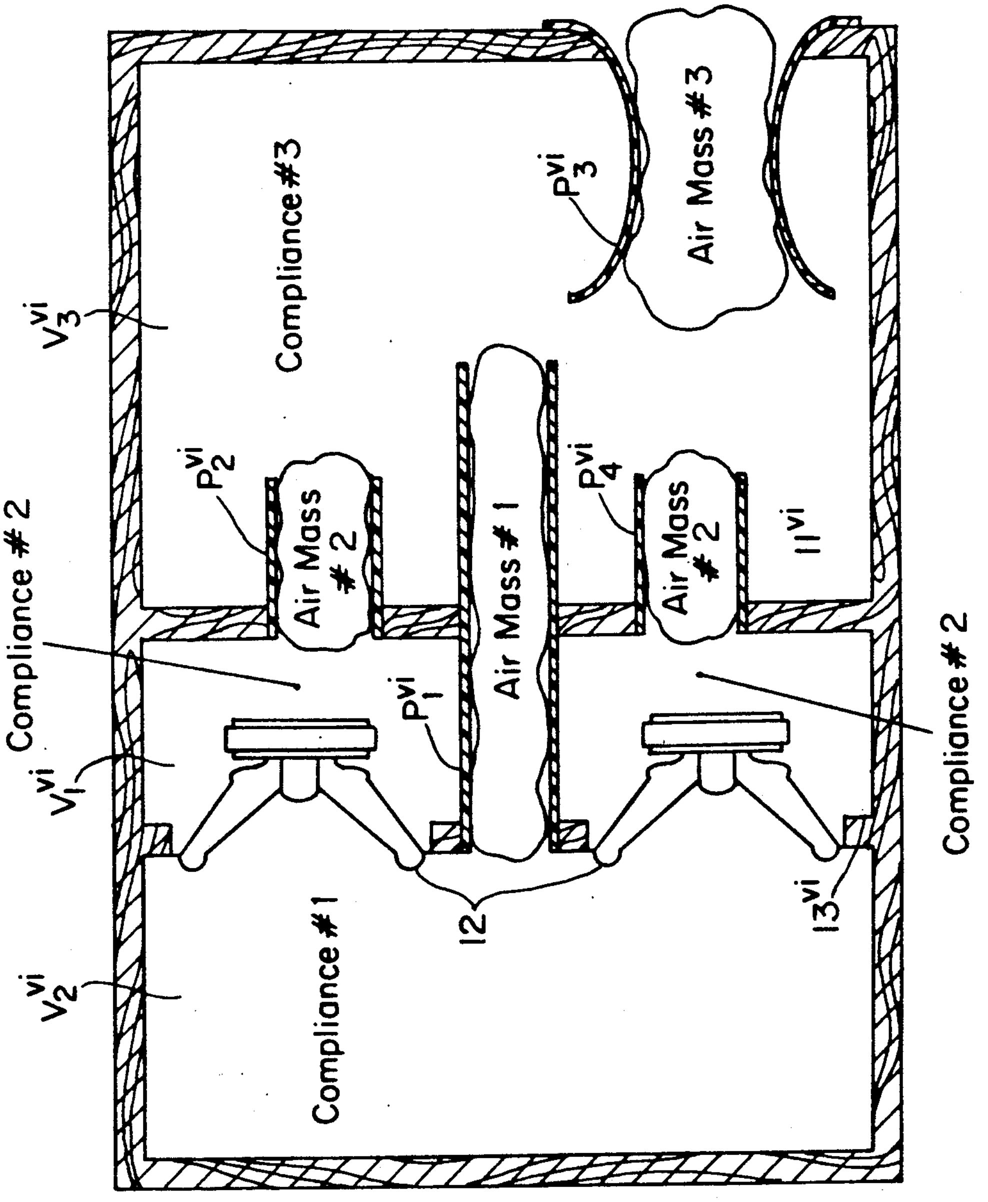
FIG. 37 is a simplified cross section of the embodiment of FIG. 36.

Referring to FIG. 37, there is shown a simplified cross section of the embodiment of FIG. 36.

This embodiment of the invention is embodied in the commercial ACOUSTIMASS®-5 series II bass module being manufactured and sold by the assignee of this application. This commercial embodiment has the following representative parameters:

Volume of intermediate subchamber $V_1{}^{vi}$ $0.00413m^3$

Volume of end subchamber $V_2{}^{vi}$ $0.00657m^3$

Volume of end subchamber $V_3{}^{vi}$ $0.0119m^3$

Port tube passive radiator $P_1{}^{vi}$ 0.203m long by 0.44m in diameter.

Port tubes passive radiator $P_2{}^{vi}$ each 0.057m long by 0.051m in diameter.

Flared port tube passive radiator $P_3{}^{vi}$ 0.12m long by 0.12m in diameter at each end and 0.058m in diameter at the center bounded by the inside of a toroid of elliptical cross section. The ellipse has a major diameter substantially equal to the length of the tube.

Figure 38:
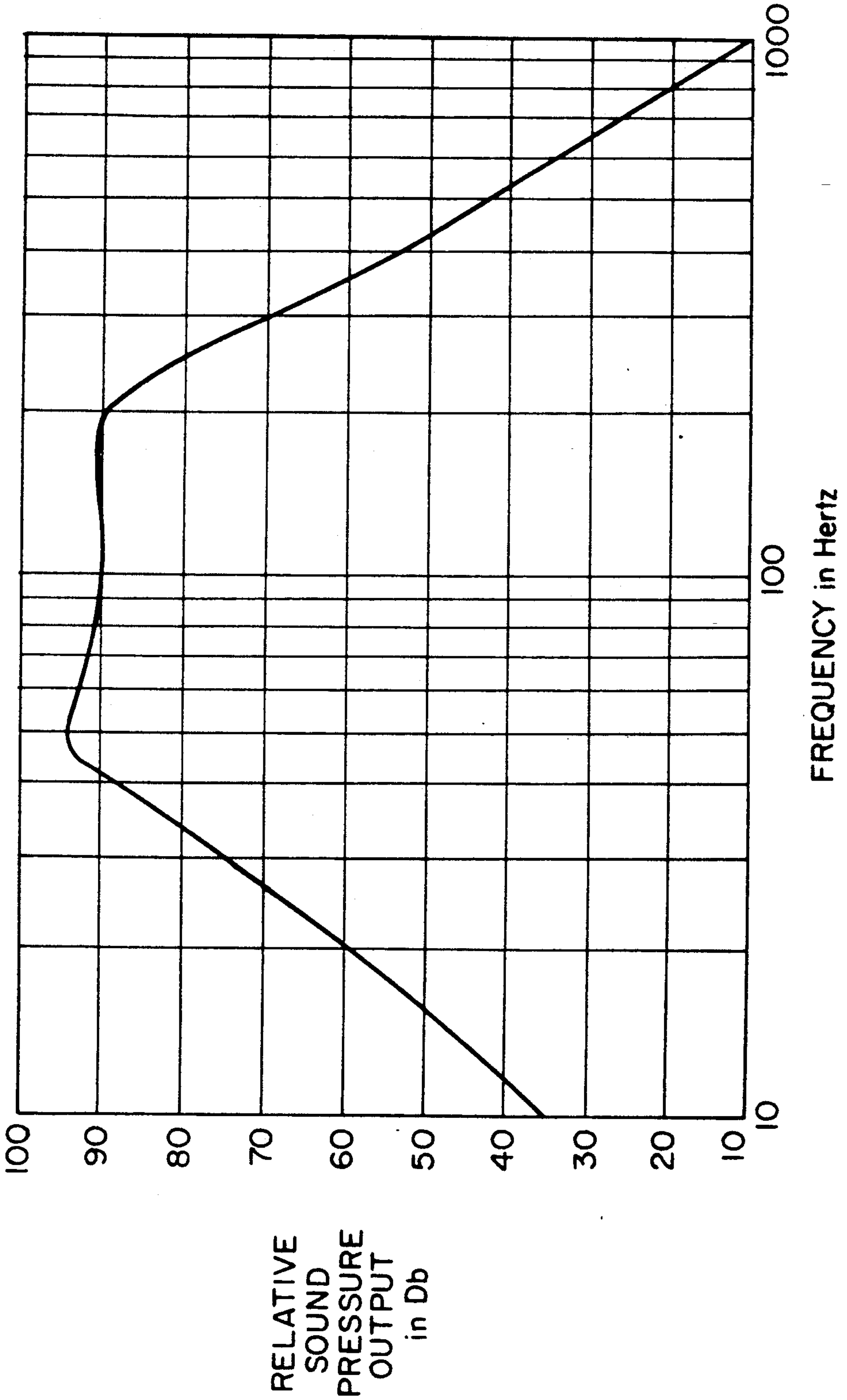
FIG. 38 is a graphical representation of the frequency response of the commercial embodiment of FIGS. 36 and 37.

The woofers are 14 cm diameter woofers. These parameters produce three deflection minima at 44 Hz, 80 Hz and 190 Hz and provide the frequency response characteristic shown in FIG. 38 having a relatively uniform response over the bass frequency range and a sharp cutoff at 30 db per octave above 200 Hz to sharply reduce the radiation of undesired harmonics through flared port $P_3^{vi}$.

The tapered cross section of flared port tube $P_3^{vi}$ helps avoid nonlaminar airflow to the region outside the enclosure that might produce audible noise when radiating at high pressure levels.

In this specific embodiment the volumes of end subchambers $V_1^{vi}$ and $V_3^{vi}$ are unequal and greater than the volume of intermediate subchamber $V_2^{vi}$. Port tubes $P_2^{vi}$ are symmetrical about port tube $P_1$ to provide equal acoustic loading to each of the two woofers. Having the end chambers coupled by the port tube through the intermediate subchamber facilitates manufacture and helps achieve a desired performance level with a thinner enclosure. Having one end of each port tube flush with a supporting intermediate wall increases the effective acoustic mass for a given port tube length.

An advantage of the invention is that with at least three spaced deflection minima within the passband, diaphragm displacement to produce a prescribed sound level is reduced. This feature allows use of smaller woofers that may be supported upon a relatively small baffle parallel and perpendicular to enclosure sides in an enclosure of the same volume as a prior art enclosure having larger woofers mounted on a slanted baffle.

Figure 39:
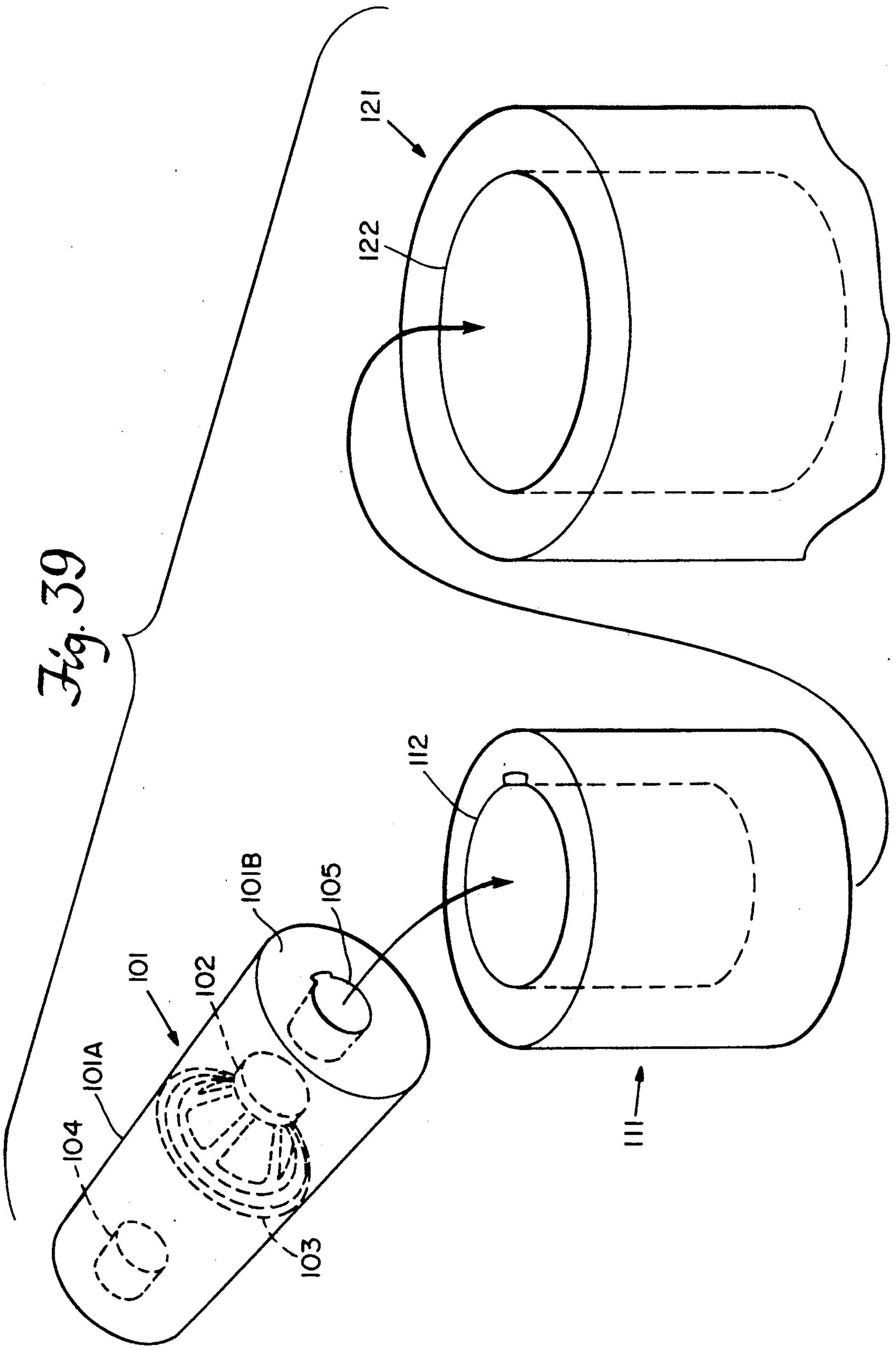
FIG. 39 is a pictorial representation of another embodiment of the invention comprising nesting cylindrical structures.

Referring to FIG. 39, there is shown still another embodiment of the invention comprising cylindrical subchambers. A first cylindrical structure 101 defines subchambers 101A and 101B separated by an internal circular baffle 102 carrying woofer 103 with end port tubes 104 and 105. Cylindrical structure 101 may then be placed through the circular opening of port 112 in cylindrical structure 11 to define another subchamber formed by the region between cylindrical structure 101 and the contiguous cylindrical region of structure 111 Cylindrical structure 121 may then similarly accommodate nested structures 101 and 111 through port 122 to define still another subchamber surrounding cylindrical structures 101 and 111 and partially cylindrical. It is within the principles of the invention to form similar nesting structures of elliptical, triangular, square or other cross sections. Applying this nesting principle allows for implementing a modular building-block approach to forming enclosures, whereby a selected level of bass response may be achieved by adding completely passive subchambers to one or more basic drive units.

Figure 40A:
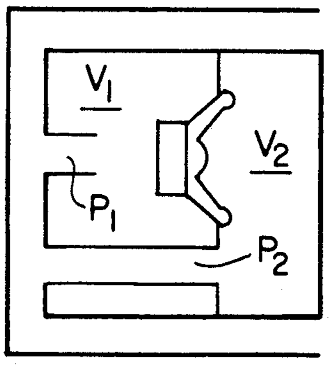
FIGS. 40A and 40B show shipping and use positions, respectively, of a variation of the embodiment of FIG. 39.
Figure 40B:
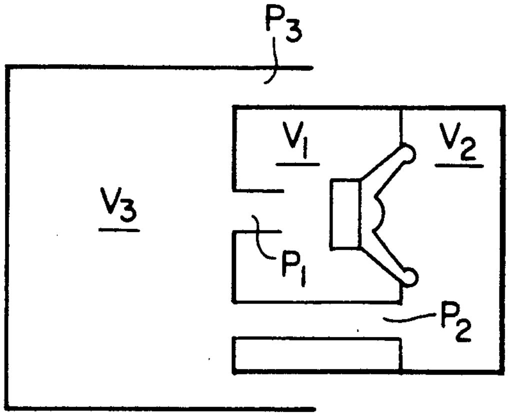

Referring to FIGS. 40A and 40B, there are shown shipping and use positions, respectively, of a variation of the embodiment of FIG. 39. Applying this nesting principle allows for making a compact portable bass system, whereby the larger, outer subchamber collapsed serve as a carrying case during transport of shipment as shown in FIG. 40A, but can be extended to define a subchamber of larger volume for better bass reproduction as shown in FIG. 40B.

Other embodiments are within the claims.

We claim:

1. A loudspeaker system comprising, at least a first electroacoustical transducer having a vibratable diaphragm for converting an input electrical signal into a corresponding acoustic output signal, an enclosure, said enclosure being divided into at least first, second and third subchambers by at least first and second dividing walls, said first dividing wall supporting and coacting with said first electroacoustical transducer to bound said first and said second subchambers, at least a first passive radiator intercoupling said first and third subchambers, at least a second passive radiator intercoupling at least one of said second and third subchambers with the region outside said enclosure, each of said passive radiators characterized by acoustic mass, each of said subchambers characterized by acoustic compliance, said acoustic masses and said acoustic compliances selected to establish at least three spaced frequencies in the passband of said loudspeaker system at which the deflection characteristic of said vibratable diaphragm as a function of frequency has a minimum.

2. A loudspeaker system in accordance with claim 1 wherein said second passive radiator intercouples said second subchamber with the region outside said enclosure, and further comprising, at least a third passive radiator intercoupling at least the other of said second and third subchambers with the region outside said enclosure.

3. A loudspeaker system in accordance with claim 1 and further comprising, at least a fourth subchamber separated from at least one other of said subchambers by at least a third dividing wall, at least a third passive radiator intercoupling said fourth subchamber with at least one other of said subchambers, said acoustic masses and said acoustic compliances selected to also establish at least a fourth frequency spaced from said at least three spaced frequencies in the passband of said loudspeaker system at which the deflection characteristic of said vibratable diaphragm as a function of frequency has a minimum.

4. A loudspeaker system in accordance with claim 3 and further comprising, at least a fourth passive radiator intercoupling said fourth subchamber with the region outside said enclosure.

5. A loudspeaker system in accordance with claim 1 and further comprising, at least a third passive radiator intercoupling said second and third subchambers.

6. A loudspeaker system in accordance with claim 1 wherein said first and third subchambers are end subchambers, and said second passive radiator is located in said third subchamber.

7. A loudspeaker system in accordance with claim 6 wherein said first passive radiator passes through said second subchamber.

8. A loudspeaker system in accordance with claim 6 wherein said second passive radiator is a port tube bounded by the inside surface of a toroid of substantially elliptical cross section.

9. A loudspeaker system in accordance with claim 7 wherein said second passive radiator is a port tube bounded by a surface of a toroid of substantially elliptical cross section.

10. A loudspeaker system in accordance with claim 8 wherein said second passive radiator is a port tube bounded by said inside surface with said elliptical cross section having a major diameter corresponding substantially to the length of said port tube.

11. A loudspeaker system in accordance with claim 9 wherein said second passive radiator is a port tube bounded by said inside surface with said elliptical cross section having a major diameter corresponding substantially to the length of said port tube.

12. A loudspeaker system in accordance with claim 1 wherein said second passive radiator intercouples said second subchamber with the region outside said enclosure, and further comprising at least a third passive radiator intercoupling said first and second subchambers.

13. A loudspeaker system in accordance with claim 1 and further comprising, at least a fourth subchamber separated from at least one other of said subchambers by at least a third dividing wall, at least a third passive radiator intercoupling said second and fourth subchambers, and at least a fourth passive radiator intercoupling said second and fourth subchambers, said acoustic masses and said acoustic compliances selected to also establish at least a fourth frequency spaced from said at least three spaced frequencies in the passband of said loudspeaker system at which the deflection characteristic of said vibratable diaphragm as a function of frequency has a minimum.

14. A loudspeaker system in accordance with claim 1 and further comprising, at least a fourth subchamber separated from at least one other of said subchambers by at least a third dividing wall, at least a third passive radiator intercoupling said fourth subchamber with said third subchamber, at least a fourth passive radiator intercoupling said fourth subchamber with said second subchamber, said acoustic masses and said acoustic compliances selected to also establish at least a fourth frequency spaced from said at least three spaced frequencies in the passband of said loudspeaker system at which the deflection characteristic of said vibratable diaphragm as a function of frequency has a minimum.

15. A loudspeaker system in accordance with claim 1 and further comprising, at least a fourth subchamber separated from at least the other of said subchambers by at least a third dividing wall, said first and third passive radiators and said fourth subchamber intercoupling said first and third subchambers, said fourth passive radiator intercoupling said second subchamber and the region outside said enclosure, said acoustic masses and said acoustic compliances selected to also establish at least a fourth frequency spaced from said at least three spaced frequencies in the passband of said loudspeaker system at which the deflection characteristic of said vibratable diaphragm as a function of frequency has a minimum.

16. A loudspeaker system in accordance with claim wherein at least one of said subchambers nests inside another of said subchambers.

17. A loudspeaker system in accordance with claim 16 wherein said at least one and said another subchambers are relatively movable between a transport contracted position and a use extended position.

* * * * *

UNITED STATES PATENT AND TRADEMARK OFFICE
CERTIFICATE OF CORRECTION

PATENT NO. : 5,092,424

DATED : March 3, 1992

INVENTOR(S) : William P. Schreiber et al.

It is certified that error appears in the above-identified patent and that said Letters Patent is hereby corrected as shown below:

On the title page, item [75] Inventors:

In the Inventors: "both" should read --Gerald F. Caron, Andover, all--.

Column 13, line 20, "$V_1^1$" should read --$V_1^v$--.

Line 22, "$V_1^v$" should read --$V_2^v$--.

Line 25, the arrow should be --=--.

Column 15, line 34, "11" should read --111--.

Line 36, should end --.--.

Signed and Sealed this

Seventeenth Day of May, 1994

Attest:

BRUCE LEHMAN

*Attesting Officer* *Commissioner of Patents and Trademarks*

UNITED STATES PATENT AND TRADEMARK OFFICE

CERTIFICATE OF CORRECTION

PATENT NO. : 5,092,424

DATED : March 3, 1992

INVENTOR(S) : William P. Schreiber et al.

It is certified that error appears in the above-identified patent and that said Letters Patent is hereby corrected as shown below:

Column 15, line 53, "of" should read --or--.

Line 55, after "subchamber" should be --$V_3$--.

Line 56, after "40B" should read --that coacts with subchambers $V_1$ and $V_2$ and ports $P_1$, $P_2$ and $P_3$.--.

In the drawings:

In FIGS. 6, 11A, 17, 23, 29 and 35 "μSEC" should read --MSEC--.

Signed and Sealed this

Eighteenth Day of July, 1995

Attest:

Bruce Lehman

BRUCE LEHMAN

*Attesting Officer*

*Commissioner of Patents and Trademarks*